(12) United States Patent
Hashimoto et al.

(10) Patent No.: US 12,240,012 B2
(45) Date of Patent: Mar. 4, 2025

(54) COATING FILM FORMING METHOD, COATING FILM FORMING APPARATUS, AND STORAGE MEDIUM

(71) Applicant: Tokyo Electron Limited, Tokyo (JP)

(72) Inventors: Yusaku Hashimoto, Koshi (JP); Kodai Yagi, Koshi (JP); Yuki Matsutake, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 106 days.

(21) Appl. No.: 18/150,818

(22) Filed: Jan. 6, 2023

(65) Prior Publication Data
US 2023/0219116 A1    Jul. 13, 2023

(30) Foreign Application Priority Data

Jan. 11, 2022   (JP) .................................. 2022-002530

(51) Int. Cl.
*B05D 3/04*      (2006.01)
*H01L 21/02*     (2006.01)
*H01L 21/027*    (2006.01)

(52) U.S. Cl.
CPC ........ *B05D 3/0473* (2013.01); *H01L 21/0206* (2013.01); *H01L 21/0276* (2013.01)

(58) Field of Classification Search
CPC .............. B05D 3/0473; H01L 21/0206; H01L 21/0276
See application file for complete search history.

(56) References Cited

U.S. PATENT DOCUMENTS

2013/0008868 A1* 1/2013 Uozumi ............ H01L 21/67739
134/1

FOREIGN PATENT DOCUMENTS

JP        H10-261579 A    9/1998

* cited by examiner

*Primary Examiner* — Nathan T Leong
(74) *Attorney, Agent, or Firm* — Armstrong Teasdale LLP

(57) ABSTRACT

A coating film forming method includes coating a coating liquid by supplying the same to a front surface of a substrate and rotating the substrate to form a coating film, supplying a high-temperature gas having a temperature higher than the substrate to an exposed region of a rear surface of the substrate, adjusting film thickness distribution of the coating film in a plane of the substrate by rotating the substrate at a first rotation speed, and drying, after the adjusting the film thickness distribution, the coating film by adjusting the film thickness of the coating film in an entire plane of the substrate by rotating the substrate at a second rotation speed different from the first rotation speed. A period in which the drying of the coating film is performed includes a period in which the supplying of the high-temperature gas to the substrate is stopped.

7 Claims, 14 Drawing Sheets

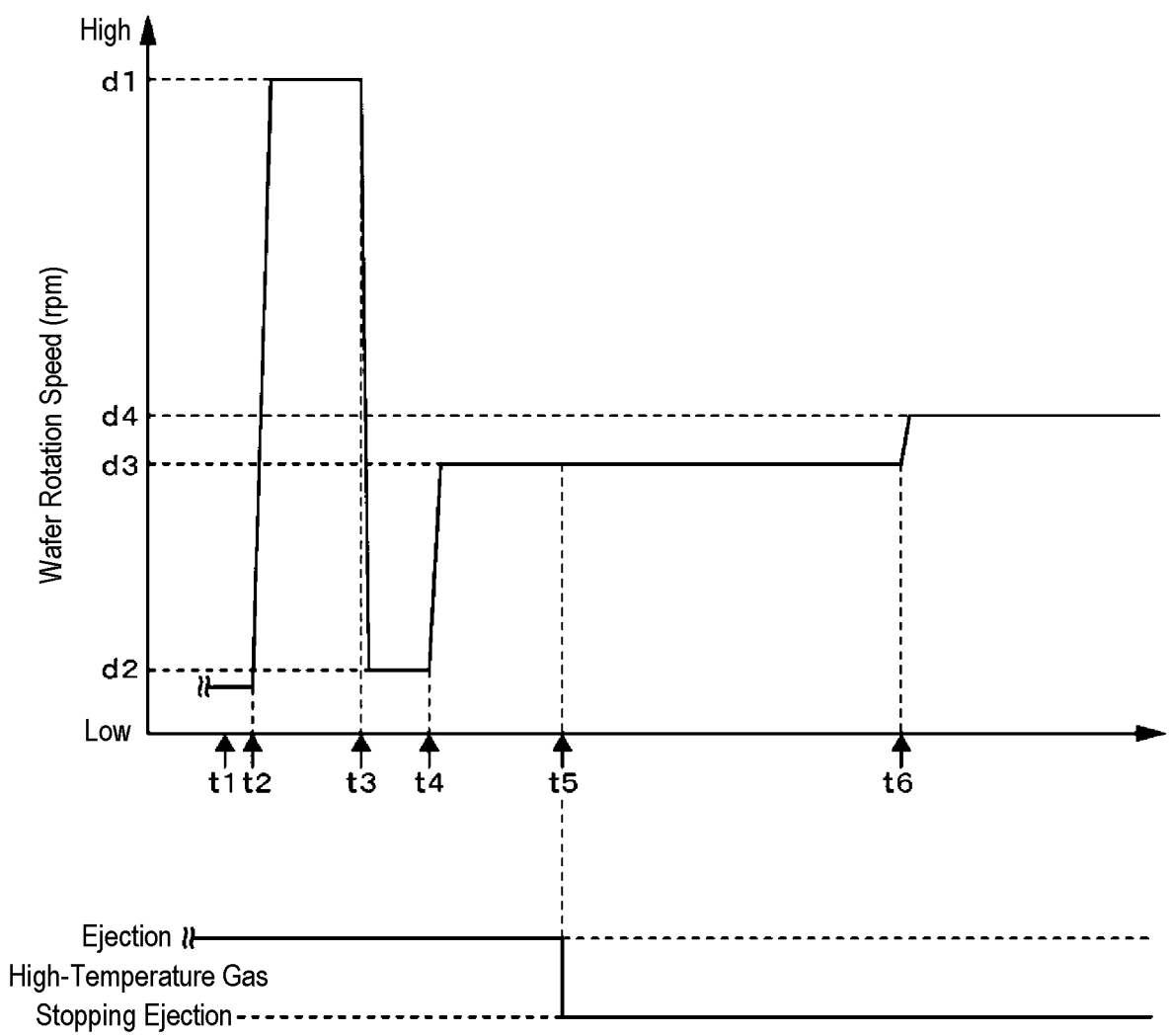

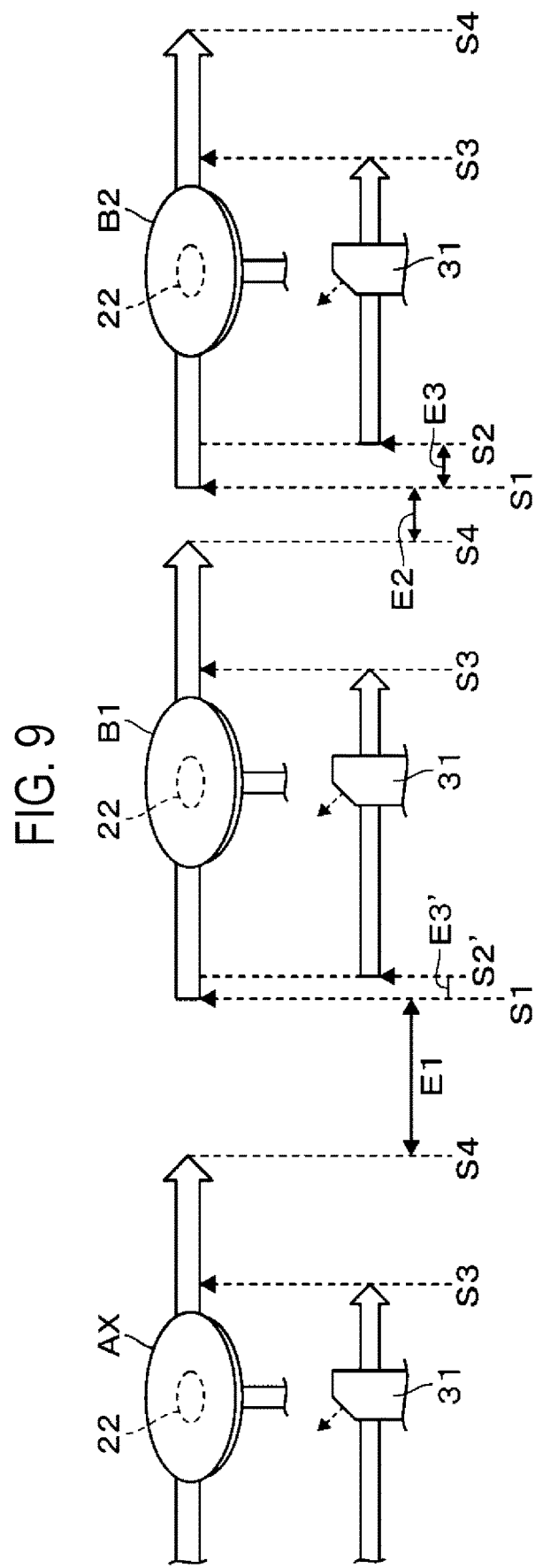

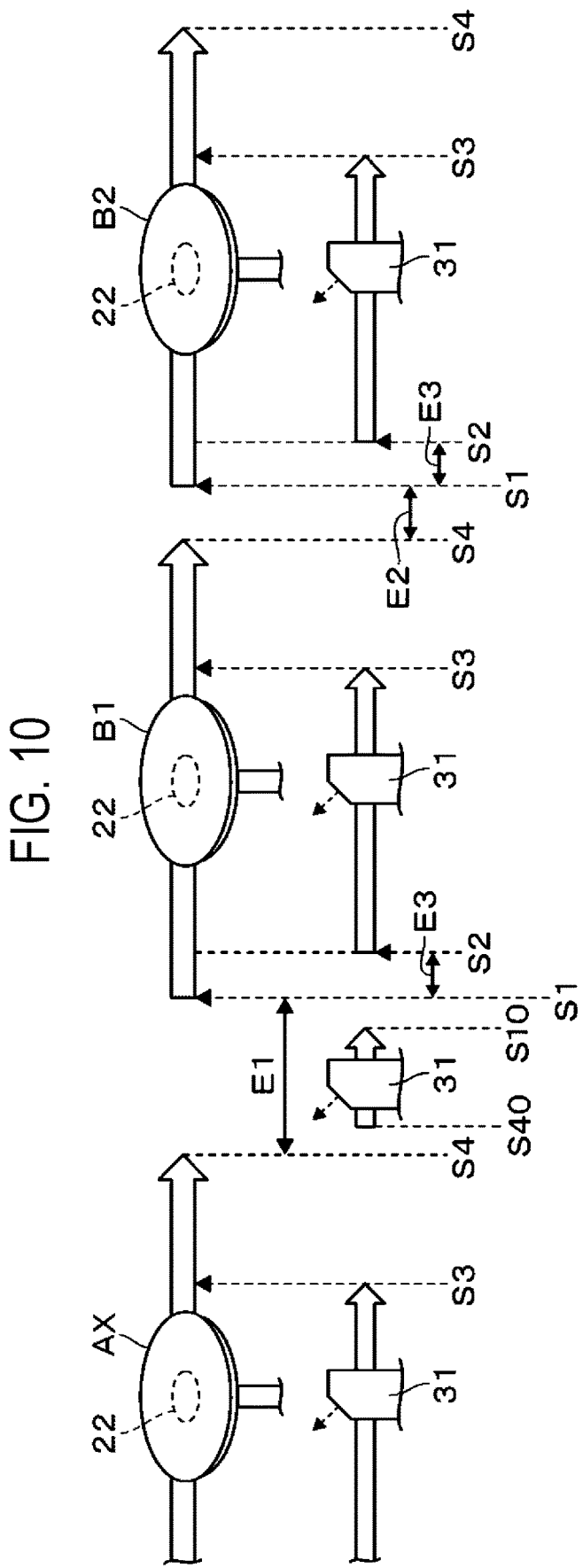

COATING FILM FORMING METHOD, COATING FILM FORMING APPARATUS, AND STORAGE MEDIUM

CROSS-REFERENCE TO RELATED APPLICATION

This application is based upon and claims the benefit of priority from Japanese Patent Application No. 2022-002530, filed on Jan. 11, 2022, the entire contents of which are incorporated herein by reference.

TECHNICAL FIELD

The present disclosure relates to a coating film forming method, a coating film forming apparatus, and a storage medium.

BACKGROUND

In a semiconductor device manufacturing process, various coating liquids such as a resist are supplied to a semiconductor wafer (hereinafter, referred to as a "wafer") to form coating films.

Patent Document 1 describes a resist coating apparatus provided with a rotary table to which a substrate is fixed such that a central portion of the rear surface thereof overlaps the rotary table, and a nozzle that is provided below the fixed substrate. It is illustrated that heated high-pressure gas is sprayed from a nozzle across the peripheral edge of the substrate that is not overlapping the rotary table. In addition, it is described that the resist supplied to the front surface of the substrate is prevented from adhering to the peripheral edge of the rear surface of the substrate by the action of the high-pressure gas.

PRIOR ART DOCUMENT

Patent Document

Japanese Laid-Open Patent Publication No. h10-261579

SUMMARY

According to one embodiment of the present disclosure, there is provided a coating film forming method including coating a coating liquid by supplying the same to a front surface of a substrate and rotating the substrate to form a coating film, supplying a high-temperature gas having a temperature higher than the substrate to an exposed region of a rear surface of the substrate, adjusting film thickness distribution of the coating film in a plane of the substrate by rotating the substrate at a first rotation speed, and drying, after the adjusting the film thickness distribution, the coating film by adjusting the film thickness of the coating film in an entire plane of the substrate by rotating the substrate at a second rotation speed different from the first rotation speed. A period in which the drying of the coating film is performed includes a period in which the supplying of the high-temperature gas to the substrate is stopped.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 8 is a chart illustrating an ejection state of a high-temperature gas from the gas nozzle and changes in the rotation speed of a wafer processed by the apparatus.

FIG. 9 is a chart illustrating an ejection period of a high-temperature gas from the gas nozzle and a wafer transport interval.

FIG. 10 is a chart illustrating an ejection period of a high-temperature gas from the gas nozzle and a wafer transport interval.

DETAILED DESCRIPTION

Figure 1:
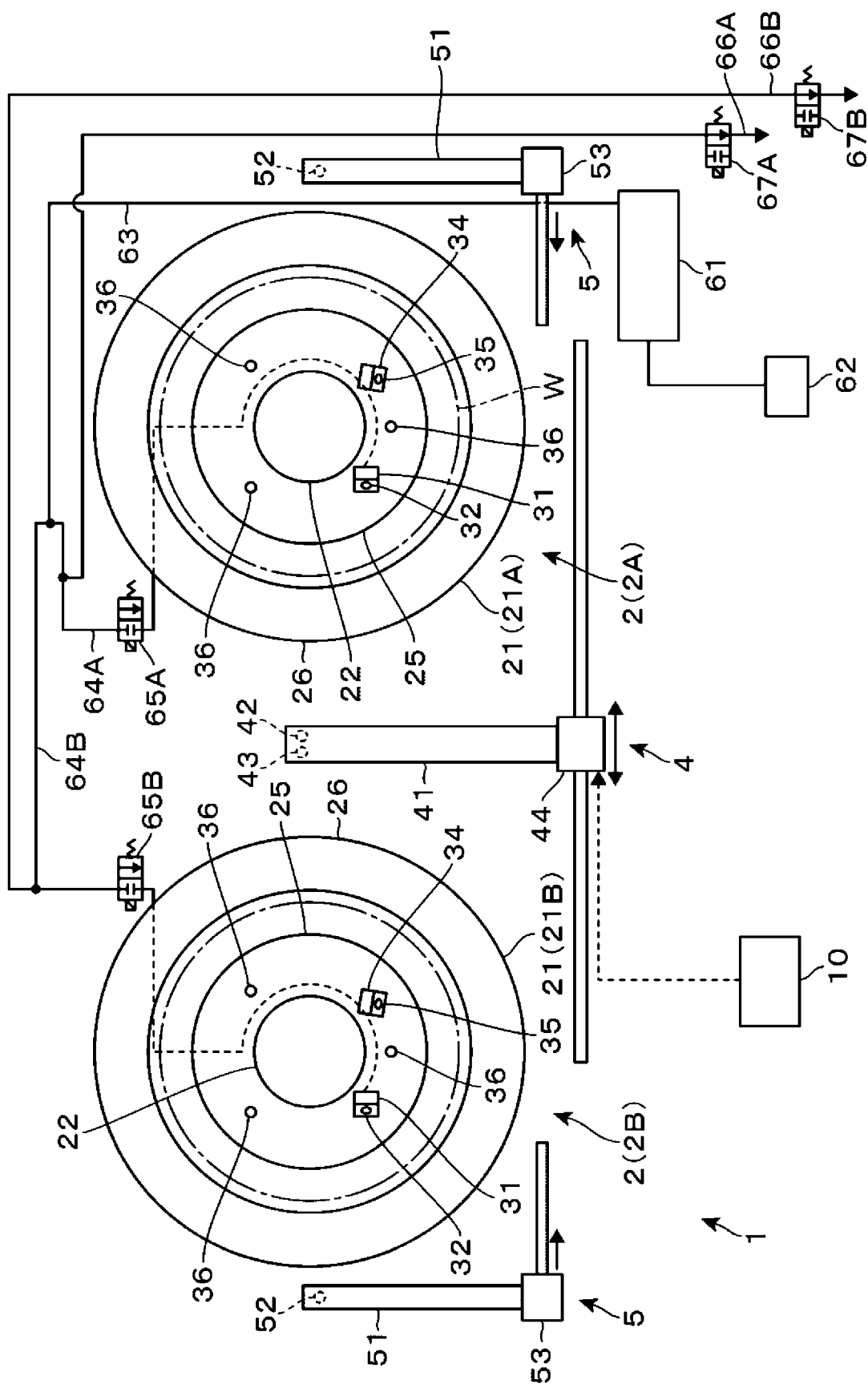
FIG. 1 is a plan view of a coating film forming apparatus of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A coating film forming apparatus 1, which is an embodiment of the coating film forming apparatus of the present disclosure, will be described. The outline of the coating film forming apparatus 1 will be described with reference to the plan view of FIG. 1. The coating film forming apparatus 1 forms a resist film R by supplying a resist as a coating liquid to a central portion of a front surface of a wafer W, which is, for example, a circular substrate having a diameter of 300 mm, and rotating the wafer W such that the resist is spread to the peripheral edge of the wafer W by centrifugal force. That is, the resist film R, which is a coating film, is formed by spin coating. The viscosity of the resist used in this example is relatively high (e.g., 10 cP or more at normal temperature). The coating film forming apparatus 1 is configured to perform a pre-process (pre-wetting) in which a thinner is spin-coated in the same manner as the resist before supplying the resist. This pre-wetting is a process for improving the wettability of a resist on the front surface of a wafer W.

The coating film forming apparatus 1 is configured to eject a high-temperature gas from a nozzle to a local region in the radial direction of the peripheral edge portion of a rear surface of a rotating wafer W, wherein the gas has a temperature higher than that of the wafer W. In order to describe the role of this high-temperature gas, it is assumed that the apparatus is not configured to supply the high-temperature gas to the wafer W. In a semiconductor device manufacturing process, it is desired to reduce the amount of the resist used for processing one wafer W. However, in the case where the amount of a resist supplied to the wafer W is small, when the thinner is supplied to the central portion of the wafer W to be spin-coated and then the resist is spin-coated, it may be difficult to make the in-plane film thickness uniformity of the resist film R sufficiently high in some cases.

A more specific description will be given with reference to the graph of FIG. 2. The horizontal axis of the graph represents each position in the diameter of a wafer W as a distance (unit: mm) from the center of the wafer W, in which the positions at one end side and the positions at the other end side of the wafer W are represented as distances with plus signs and as distances with minus signs, respectively. The vertical axis of the graph represents the film thickness (unit: nm) of the resist film R, and is marked with a scale whenever the thickness increases from a nm by b nm. a and b are predetermined positive values. When the resist film R is formed without supplying a high-temperature gas, the film thickness distribution may become as indicated by the chain line in the graph. Specifically, there may be a film thickness distribution in which the film thickness in an annular region along the circumference of the wafer W in the peripheral edge portion of the wafer W becomes smaller than the film thickness in other regions. The annular region may be hereinafter referred to as an "annular low-film-thickness region". As will be described later with an evaluation experiment, it is possible to reduce the in-plane film thickness variation of the wafer W by preventing the formation of the annular low film thickness region by adjusting a thinner supply position during pre-wetting. However, in that case, the coatability of the front surface of the wafer W with the resist film R is deteriorated.

Therefore, the coating film forming apparatus 1 is configured to eject the above-described high-temperature gas to the rear surface of a rotating wafer W in order to prevent the formation of the annular low-film-thickness region while ensuring sufficient coatability of the resist film R. This high-temperature gas is ejected to the rear surface side of the annular low-film-thickness region that would be formed when the high-temperature gas was not ejected, and raises the temperature of the annular region to which the high-temperature gas is ejected.

Figure 2:
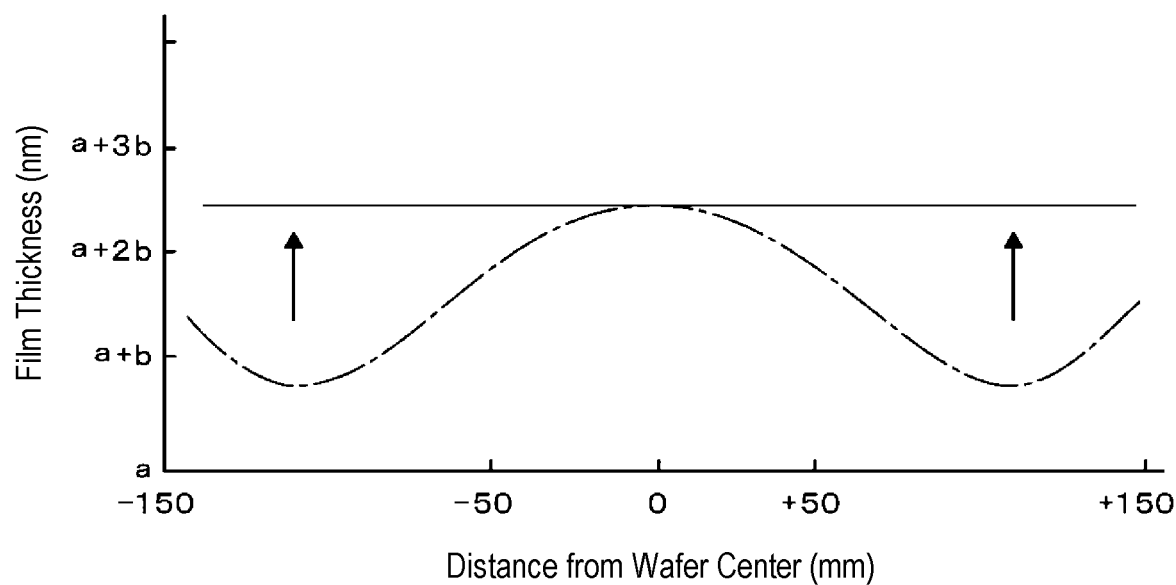
FIG. 2 is a graph for describing the effects of the coating film forming apparatus.

The heating accelerates drying of the resist in the annular region, so that solid components in the resist accumulate and the film thickness of the annular region is made to be equal to the film thickness of the other regions, thereby improving the film thickness uniformity of the resist film in the plane of the wafer W so that the film thickness distribution represented by the solid line in FIG. 2 is achieved. However, when the supply of the high-temperature gas is continued during the processing of the wafer W, the film thickness in the annular region becomes too large. Thus, there is a risk that the in-plane film thickness distribution uniformity of the wafer W will be deteriorated. In order to prevent this, the supply of the high-temperature gas is stopped during the processing of the wafer W.

Returning to FIG. 1, the configuration of the coating film forming apparatus 1 will be described in detail. The coating film forming apparatus 1 includes two processing parts 2, a main processing mechanism 4, and two edge bead removal (EBR) mechanisms 5. The two processing parts 2 are similarly configured and include circular cups 21, respectively, each of which is configured to store a wafer W for processing. The main processing mechanism 4 includes nozzles for ejecting thinner and a resist, respectively, and a movement mechanism for each nozzle, and is shared by the two processing parts 2. Each EBR mechanism 5 is a mechanism provided for each processing parts 2 to perform EBR for removing an unnecessary resist film R by supplying thinner to the peripheral edge portion of the wafer W. The two EBR mechanisms 5 are similarly configured.

As described above, two cups 21 are provided and located at the same height. The direction in which these cups 21 are arranged will be described as the left-right direction. A wafer W is transferred from a rear of the cup 21 to each cup 21 by a transfer mechanism. In order to distinguish the left and right processing parts 2 from each other, when viewed from the front to the rear, the right processing part 2 may be denoted as 2A and the left processing part 2 may be denoted as 2B. In addition, the cup 21 of the processing part 2A and the cup 21 of the processing part 2B may be denoted as 21A and 21B, respectively.

Hereinafter, a processing part 2 will be described with reference to the vertical cross-sectional side view of FIG. 3 as well. The processing part 2 includes a spin chuck 22, a rotation mechanism 24, a gas nozzle 31, and a cleaning nozzle 34 in addition to the above-described cup 21. The spin chuck 22 forms a circular stage on which a wafer W is placed. The spin chuck 22 overlaps the central portion of the rear surface of the wafer W and holds the wafer W horizontally by attracting the central portion. The spin chuck 22 is connected to the rotation mechanism 24 via a vertically extending rotation shaft 23. The spin chuck 22 rotates around a vertical axis by the rotation mechanism 24 including a motor, and the wafer W attracted to the spin chuck 22 also rotates accordingly. The respective central axes of the spin chuck 22 and the cup 21 are aligned with each other, and the center of the wafer W is held by the spin chuck 22 to overlap the central axes, and rotates around the central axes. The rotating direction of the wafer W is clockwise in a plan view.

The cup 21 includes a base 25 and a main body 26. The main body 26 forms a side wall of the cup 21 that surrounds the spin chuck 22, which is a stage for the wafer W, and the wafer W held by the spin chuck 22. The lower end of the side wall of the cup 21 extends toward the center of the cup 21 and further extends upward to form an annular recess 27 in the rotating direction of the spin chuck 22. The annular recess 27 is provided with a drainage port and an exhaust pipe for exhausting the interior of the cup 21, but illustration of the drainage port and the exhaust pipe is omitted. The upper end of the inner peripheral side of the annular recess 27 extends toward the center of the cup 21 to form a flange.

The base 25 is configured in the shape of a horizontal disk and forms the bottom of the cup 21. A peripheral edge of the base 25 protrudes upward and forms a connecting portion formed along the periphery of the flange of the main body 26, and the connecting portion and the flange are connected to each other. The spin chuck 22 is disposed above the base 25, the rotation mechanism 24 is disposed below the base 25, and the rotation shaft 23 passes through the base 25. In FIG. 3, reference numeral 28 denotes support members configured to support the base 25 on the rotation mechanism 24.

A vertically long block-shaped gas nozzle 31 is provided to pass through the base 25, and a gas ejection port 32 is formed at the upper end of the gas nozzle 31 located above the base 25. The gas ejection port 32, which is a first ejection port, ejects the above-described high-temperature gas to a local position on the rear surface of a rotating wafer W. More specifically, the peripheral edge portion of the rear surface of the wafer W is exposed without being covered with the spin chuck 22. The high-temperature gas is ejected toward a radially partial region of the wafer W in this exposed peripheral edge portion. This high-temperature gas has a temperature of, for example, about 50 degrees C. at the gas ejection port 32 so as to heat the wafer W when ejected onto the wafer W as will be described later. The lower end of the gas nozzle 31 is located above the rotation mechanism 24. In addition, the gas nozzle 31 is disposed on the front side with respect to the spin chuck 22 in a plan view.

A cleaning nozzle 34 is provided at a position shifted in the circumferential direction of the base 25 with respect to the gas nozzle 31. Like the gas nozzle 31, the cleaning nozzle 34 is also configured in a vertically long block shape. A cleaning liquid ejection port 35 serving as a second ejection port is formed at the upper end of the cleaning nozzle 34 located above the base 25. The cleaning nozzle 34 ejects a cleaning liquid supplied from a cleaning liquid source through a flow path (not illustrated) to a local position on the rear surface of the rotating wafer W to clean the rear surface of the wafer W. That is, the cleaning liquid is also ejected to the exposed region not covered with the spin chuck 22. The temperature of the cleaning liquid ejected from the cleaning nozzle 34 is lower than the temperature of the high-temperature gas ejected from the gas nozzle 31, and is normal temperature (specifically, 20 degrees C. to 30 degrees C.). This cleaning liquid is, for example, thinner. The gas nozzle 31 and the cleaning nozzle 34 will be described in more detail later.

Figure 3:
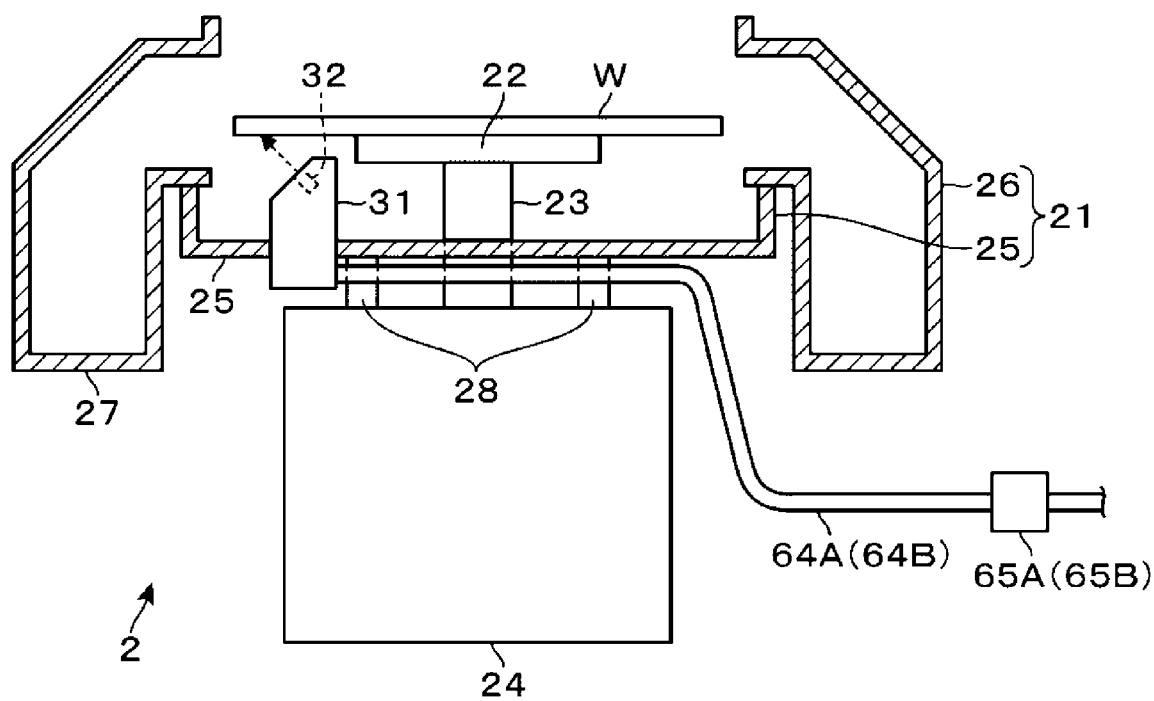
FIG. 3 is a vertical cross-sectional side view of a processing part included in the coating film forming apparatus.

Although an illustration is omitted in FIG. 3, three vertically extending pins 36 are provided in the cup 21 and each penetrate the base 25, as illustrated in FIG. 1. The pins 36 are raised and lowered by a lifting mechanism to deliver a wafer W between a transport mechanism and the spin chuck 22. Illustrations of the lifting mechanism and the transport mechanism are omitted.

Next, the main processing mechanism 4 will be described. The main processing mechanism 4 includes an arm 41 the tip side of which is directed rearward, a resist ejection nozzle 42 and a pre-wetting thinner ejection nozzle 43 each of which is provided on the tip side of the arm 41, and a movement mechanism 44. The movement mechanism 44 is located on the front side of the cup 21, and the base end side of the arm 41 is connected to the movement mechanism 44. The movement mechanism 44 is movable left and right together with the arm 41 and is able to raise and lower the arm 41.

By the movement mechanism 44, each of the resist ejection nozzle 42 and the thinner ejection nozzle 43 is movable between a standby region (not illustrated) outside the cup 21 and an ejection position above the central portion of the wafer W. The resist ejection nozzle 42 and the thinner ejection nozzle 43 eject, to the central portion of the wafer W, a resist and thinner, respectively, which are supplied from a resist source and a thinner source (not illustrated), respectively, at the ejection positions thereof. The resist ejection nozzle 42 constitutes a coating liquid supply part.

Next, the EBR mechanism 5 will be described. The EBR mechanism 5 includes an arm 51 the tip side of which is directed rearward, an EBR thinner ejection nozzle 52 provided on the tip side of the arm 51, and a movement mechanism 53. The movement mechanism 53 is located near the front side of the cup 21 among the two cups 21 in which a process is to be performed by the EBR mechanism 5 including the movement mechanism 53, and the base end side of the arm 51 is connected to the movement mechanism 53. The movement mechanism 53 is movable left and right together with, for example, the arm 51 and is able to raise and lower the arm 51. By the movement mechanism 53, the thinner ejection nozzle 52 is movable between a standby region (not illustrated) outside the cup 21 and an ejection position within the cup 21. The thinner ejection nozzle 52 ejects thinner supplied from a thinner source (not illustrated) toward the peripheral edge of the wafer W therebelow at the ejection position.

For example, a heating mechanism 61 including a heater is provided at the front of the cup 21A. The heating mechanism 61 is located away from the cup 21A so as not to affect the processing of the wafer W in the cup 21A. Cleaned air is supplied from an air source 62 through a filter (not illustrated) to the heating mechanism 61 and heated by the heating mechanism 61. This air is supplied as the above-described high-temperature gas to the gas nozzle 31 of each of the processing parts 2A and 2B through a flow path constituted with pipes. An example of the layout of these pipes in a plan view will be described below.

The downstream side of the pipe 63 extends rearward from the heating mechanism 61, passes through the right side of the cup 21A, is bent at a position on the rear of the cup 21A, and extends leftward on the rear side of the cup 21A. This pipe 63 extending leftward branches, for example, into two between the cups 21A and 21B to form pipes 64A and 64B extending leftward. The downstream side of the pipe 64A is bent back between the cups 21A and 21B so as to be directed rightward, enters a region overlapping the cup 21A, and is then bent so as to be directed frontward. In order to avoid interference with the rotation shaft 23 or the support members 28 (see FIG. 3), the portion bent to be directed frontward extends between the base 25 and the rotation mechanism 24 to bypass the rotation shaft 23 and the support members 28 and is connected to the lower end portion of the gas nozzle 31 below the base 25. The downstream side of the pipe 64B enters a region overlapping the cup 21B and is then bent to be directed frontward. Like the corresponding portion in the pipe 64A, the portion bent to be directed frontward extends between the base 25 and the rotation mechanism 24 to bypass the rotation shaft 23 and the support members 28 and is connected to the lower end portion of the gas nozzle 31.

Valves 65A and 65B are interposed in the pipes 64A and 64B near the cups 21A and 21B, respectively. The valves 65A and 65B are located below the cups 21A and 21B and outside the cups 21A and 21B in a plan view. The upstream end of the pipe 66A is connected to the upstream side of the valve 65A in the pipe 64A, and the connection position of the pipe 66A is near the valve 65A and, for example, outside the cup 21A in a plan view. The downstream side of the pipe 66A extends to be directed rightward at the rear of the cup 21A, is then bent to be directed frontward, and extends to pass the right side of the cup 21A. The upstream end of the pipe 66B is connected to the upstream side of the valve 65B in the pipe 64B, and the connection position of the pipe 64B is near the valve 65B and, for example, outside the cup 21B in a plan view. The downstream side of the pipe 66B extends to be directed rightward at the rear of the cup 21B, is then bent to be directed frontward, and extends to pass the right side of the cup 21A.

The downstream ends of the pipes 66A and 66B are connected, via respective valves 67A and 67B, to exhaust paths to which the downstream sides of the exhaust pipes of the cups 21A and 21B are connected, respectively. Therefore, in this embodiment, the pipes 66A and 66B are exhaust pipes for discharging the high-temperature gas. As described above, except for the portions of the pipes 64A and 64B provided between the rotation mechanism 24 and the base 25, each of the pipes 63, 64A, 64B, 66A, and 66B is provided in a region lower than the cups 21A and 21B.

During the operation of the coating film forming apparatus 1, the high-temperature gas is constantly supplied from the air source 62 to the pipe 63 via the heating mechanism 61. With respect to the valve 65A of the pipe 64A connected to the gas nozzle 31 of the cup 21A and the valve 67A of the pipe 66A connected to the exhaust path, when one of these valves is opened, the other is closed. Likewise, with respect to the valve 65B of the pipe 64B connected to the gas nozzle 31 of the cup 21B and the valve 67B of the pipe 66B connected to the exhaust path, when one of the valves is opened, the other is closed. Accordingly, during a period other than the period in which the high-temperature gas is ejected from the gas nozzle 31 of the cup 21A, the high-temperature gas is supplied to the pipe 66A and discharged to the exhaust path. In addition, during a period other than the period in which the high-temperature gas is ejected from the gas nozzle 31 of the cup 21B, the high-temperature gas is supplied to the pipe 66B and discharged to the exhaust path.

Therefore, the flow paths from the heating mechanism 61 to the valves 65A and 65B are heated by the high-temperature gas even during the period in which the gas nozzles 31 do not eject the high-temperature gas. Since the valves 65A and 65B are provided near the cups 21A and 21B, that is, at positions relatively close to the gas nozzles 31 as described above, relatively wide ranges of the flow paths from the heating mechanism 61 to the gas nozzles 31 will be heated. Therefore, the difference between the temperature of the high-temperature gas ejected from the gas nozzles 31 immediately after the start of ejection and the temperature during the rest of the period is suppressed so that the high-temperature gas at a desired temperature can be quickly supplied to the wafer W. Thus, it is possible to improve the throughput of the apparatus. In addition, in repeating ejection and stop of ejection of the high-temperature gas from the gas nozzles 31 in order to sequentially process a plurality of wafers W, it is possible to suppress the temperature variation of the high-temperature gas immediately after the start of ejection. Thus, it is possible to suppress the variation of processing among the wafers (that is, the film thickness variation of the resist films R).

From the viewpoint of suppressing the temperature variation of the high-temperature gas which is ejected by adjusting the temperatures of the flow paths, it is preferable that the distances between the valves 65A and 65B and the gas nozzles 31 are short. However, when the distances are too short, the bases 25 and the spin chucks 22 disposed in the cups 21 may be heated by the high-temperature gas supplied toward the valves 65A and 65B at the time of closing each of the valves 65A and 65B. In that case, due to heat conduction and radiant heat from each heated member to the wafers W, there is a possibility that a processing deviation in the plane of one wafer W and between wafers W may occur. In order to prevent such a problem, in the present embodiment, the valves 65A and 65B are provided at a height below the cups 21 and outside the cups 21 in a plan view. Since it is sufficient that the distances between the valves 65A and 65B and the gas nozzles 31 is prevented from becoming short in this way, the valves 65A and 65B may be disposed so as to meet only one of the conditions that the valves 65A and 65B should be at positions lower than the cups 21, respectively, and that the valves 65A and 65B should be provided outside the cups 21, respectively, in a plan view.

The valves 67A and 67B and the valves 65A and 65B form a switching part for switching the supply destinations of the high-temperature gas. The high-temperature gas flow paths formed by the pipes 63, 64A, and 64B constitute gas supply paths. The high-temperature gas flow paths formed by the pipes 66A and 66B form branch paths.

Figure 4:
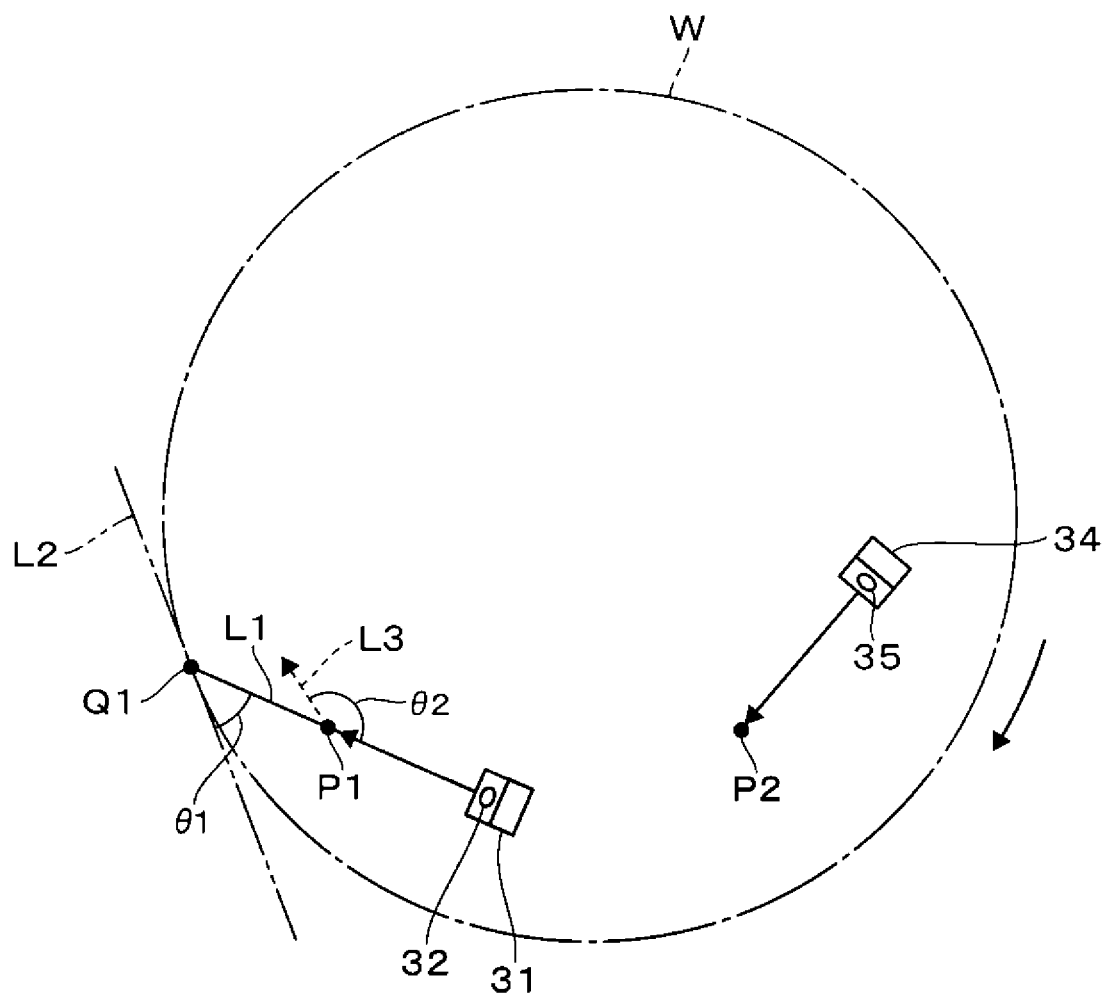
FIG. 4 is a plan view illustrating a state of ejecting a high-temperature gas and a cleaning liquid from a gas nozzle and a cleaning nozzle included in the processing part, respectively.
Figure 5:
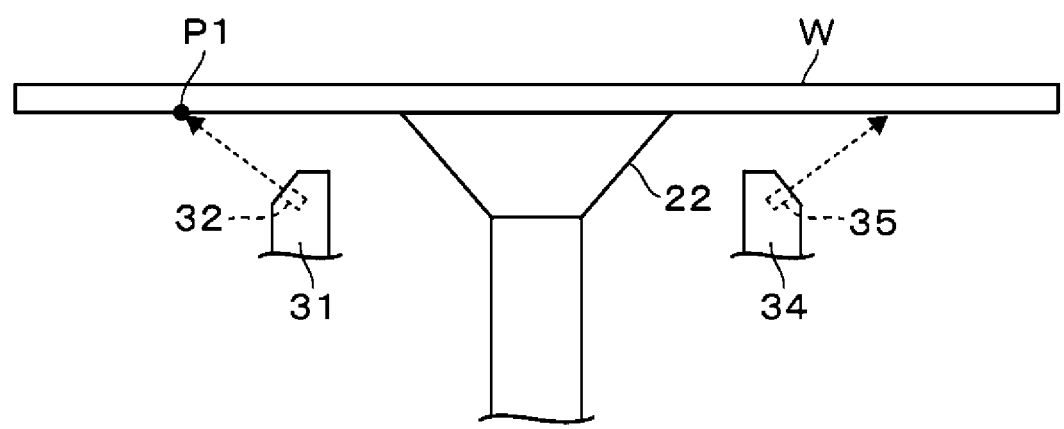
FIG. 5 is a side view illustrating the gas nozzle and the cleaning nozzle.

Next, the gas nozzle 31 and the cleaning nozzle 34 provided in the same cup 21 will be described with reference to the plan view of FIG. 4 and the side view of FIG. 5. When the high-temperature gas is ejected from the gas ejection port 32 of the gas nozzle 31, a contact region of the high-temperature gas on the rear surface of the wafer W is indicated as P1. The contact region P1, which is a first contact region, is set to overlap the annular low-film thickness region in which the thickness of the resist film becomes small when it is assumed that the high-temperature gas is not ejected as described above with reference to FIG. 2. Since the position of the annular low-film thickness region changes depending on the type of resist used and processing conditions, the position of the contact region P1 in the radial direction of the wafer W may be set according to the position of the annular low-film thickness region.

In order to cause the high-temperature gas ejected to the contact region P1 to flow to the peripheral edge of the wafer W and then to be discharged from the cup 21 without going against the action of centrifugal force generated due to the rotation of the wafer W, thereby preventing the high-temperature gas from becoming turbulent, the gas ejection port 32 is opened obliquely upward from the center side of the wafer W toward the peripheral edge side. In a plan view, a straight line drawn from the gas ejection port 32 in the ejection direction of the high-temperature gas is defined as L1. Assuming that a tangent line L2 to the wafer W that passes through the intersection Q1 between the straight line L1 and the peripheral edge of the wafer W is drawn, the straight line L1 is inclined to the tangent line L2 rather than being orthogonal to the tangent line L2 in a plan view.

Assuming that the tangent line L2 and the straight line L1 are orthogonal to each other, the distance from the contact region P1 to the peripheral edge of the wafer W along the straight line L1 is relatively short. Thus, the high-temperature gas flows outward from the peripheral edge of the wafer W at a relatively high velocity. As a result, there is a concern that the mist of thinner and/or resist on the rear surface side of the wafer W flows out of the cup 21. In order to prevent the mist from flowing out, the ejection direction of the high-temperature gas is set such that the tangent line L2 and the straight line L1 are not orthogonal to each other. In order to sufficiently obtain the effect of preventing the mist from flowing out, the angle θ1 formed by the tangent line L2 and the straight line L1 is preferably set to be, for example, less than 90°, and specifically, for example, 70°.

In addition, the high-temperature gas is ejected from the gas ejection port 32 in a direction following the rotating direction of the wafer W in a plan view, that is, in a direction that does not go against the rotation of the wafer W. More specifically, a point on the rear surface of the wafer W in the contact region P1 is in uniform circular motion due to the rotation of the wafer W. When the direction of the velocity vector (illustrated as L3) whose base point is that point in the circular motion in a plan view and the straight line L1 extending in the ejection direction of the high-temperature gas form an obtuse angle θ2, the high-temperature gas is ejected following the rotating direction of the wafer W. By ejecting the high-temperature gas in this manner, the high-temperature gas directed toward the rear surface of the wafer W is prevented from being splashed from the rear surface of the wafer W due to the rotation of the wafer W. That is, the ejected high-temperature gas flows following the rotation of the wafer W and comes into contact with the wafer W for a relatively long time, and thus it is possible to efficiently heat the wafer W.

The cleaning nozzle 34 will be explained. When the cleaning liquid is ejected from the cleaning liquid ejection port 35 of the cleaning nozzle 34, a contact region of the cleaning liquid on the rear surface of the wafer W is indicated as P2. The cleaning nozzle 34 ejects a cleaning liquid obliquely upward from the center side toward the peripheral side of the wafer W. Then, by the spread of the cleaning liquid due to the centrifugal force of the rotation of the wafer W, the region from the contact region P2, which is a second contact region, to the peripheral edge of the wafer W on the rear surface of the wafer W is cleaned.

As described above, the temperature of the cleaning liquid ejected from the cleaning nozzle 34 is lower than the temperature of the high-temperature gas ejected from the gas nozzle 31. The timing of terminating the ejection of the cleaning liquid onto the wafer W is later than the timing of terminating the ejection of the high-temperature gas onto the wafer W. Therefore, when wafers W are sequentially processed in the same cup 21, the interior of the cup 21 heated by the ejection of the high-temperature gas is cooled by the ejection of the cleaning liquid onto the wafers W and the scattering of the cleaning liquid from the wafers W. Thus, the variation in temperature inside the cup 21 during the processing of each wafer W due to heat accumulation inside the cup 21 is suppressed. Therefore, the cleaning liquid also has a role of improving the uniformity of the processes between the wafers W.

Like the gas nozzle 31, the cleaning nozzle 34 is configured to eject the cleaning liquid in a direction following the rotating direction of the wafer W in a plan view, thereby suppressing scattering of the cleaning liquid due to the rotation of the wafer W. The contact region P1 of the gas nozzle 31 and the contact region P2 of the cleaning nozzle 34 are separated from each other in the rotating direction of the wafer W. When viewed in the rotating direction, the contact region P1 of the gas nozzle 31 is located at the downstream side of the contact region P2 of the cleaning nozzle 34. When viewed in the rotating direction of the wafer W, there are two arc regions between the contact region P1 and the contact region P2. Here, the downstream side means the downstream side when viewed from the arc region having the shorter length among the two arc regions.

Let's suppose a case where the positions of the contact regions P1 and P2 in the rotating direction are reversed, and the time interval from the end of the high-temperature gas ejection period to the wafer W to the end of the cleaning liquid ejection period to the wafer W is relatively short or the high-temperature gas ejection period and the cleaning liquid ejection period overlap each other. In that case, the region of the rear surface of the wafer W to which the high-temperature gas is supplied moves together with the high-temperature gas to the vicinity of the position to which the cleaning liquid is supplied after a short period of time due to the rotation of the wafer W. That is, the cleaning liquid is supplied to a region on the rear surface of the wafer W in which a relatively large amount of high-temperature gas remains. Then, it is considered that since the high-temperature gas and the cleaning liquid interfere with each other and each scatters from the rear surface of the wafer W, and the contact time of the high-temperature gas with the rear surface of the wafer W becomes relatively short, the effect of the high-temperature gas is reduced. In addition, there is a concern that the scattered cleaning liquid becomes particles and adheres to the wafer W.

However, since the contact region P1 is located on the downstream side of the contact region P2 as described above, the region in which the high-temperature gas is supplied to the rear surface of the wafer W moves to the vicinity of the position at which the cleaning liquid is ejected over a relatively long period of time. Thus, by that time, the high-temperature gas flows out of the wafer W due to the centrifugal force of rotation. Accordingly, the above-described interference between the high-temperature gas and the cleaning liquid is more reliably suppressed, it is possible to sufficiently heat the wafer W by the high-temperature gas and it is also possible to suppress formation of particles of the cleaning liquid. In addition, since the cleaning liquid is prevented from scattering, the cleaning liquid stays in the cup 21 for a relatively long time, so that the above-described cooling effect of the cleaning liquid can be sufficiently obtained.

It has been described that the interference between the high-temperature gas and the cleaning liquid is prevented by appropriately setting the positional relationship between the contact regions P1 and P2 as described above. In the example of processing a wafer W by the coating film forming apparatus 1, after the ejection of the high-temperature gas to the wafer W is stopped, the ejection of the cleaning liquid to the wafer W is started after a while. That is, the above-mentioned interference is less likely to occur due to the time lag between the ejection period of the high-temperature gas and the ejection period of the cleaning liquid.

The coating film forming apparatus 1 includes a controller 10 (see FIG. 1). The controller 10 is configured with a computer and has a program. The program incorporates a group of steps so that a series of operations in the coating film forming apparatus 1 can be executed. Based on the program, the controller 10 output control signals to each part of the coating film forming apparatus 1 so as to control the operation of each part. Specifically, the movement of respective nozzles by the movement mechanisms 44 and 53, the opening and closing of the valves 65A, 65B, 67A and 67B, the ejection of resist and thinner from the resist ejection nozzles 42 and the thinner ejection nozzles 43 and 52, the rotation of wafers W by the rotation mechanisms 24, and the like are controlled. The above-mentioned program is stored in a non-transitory computer-readable storage medium such as a compact disc, a hard disc, or a DVD, and is installed in the controller 10.

Next, the processing of a wafer W by the coating film forming apparatus 1 will be described with reference to process diagrams of FIGS. 6A to 7D. In addition, the chart of FIG. 8 that shows a relationship between the change in the rotation speed (unit: rpm) of a wafer W and the period in which the high-temperature gas is ejected from the gas nozzle 31 to the wafer W will also be referred to as appropriate. In the following description, it is assumed that the processing part 2A among the processing parts 2A and 2B processes a wafer W.

Figure 6A:
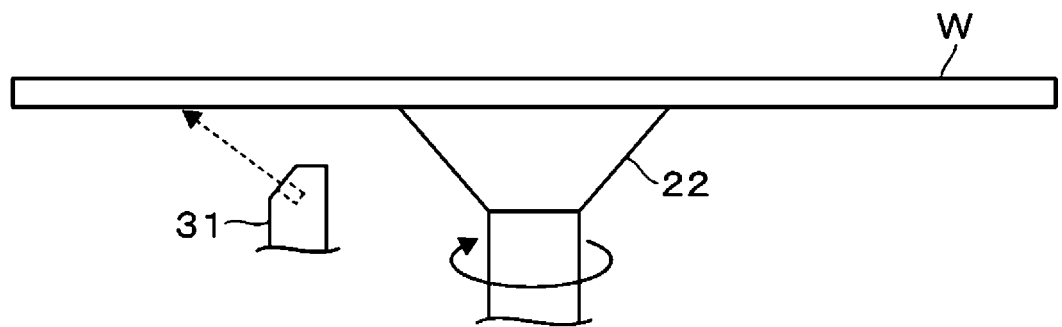
FIG. 6A is a process diagram illustrating processing in the coating film forming apparatus.

First, the wafer W is transported onto the cup 21A of the processing part 2A by the transport mechanism. At this time, the valve 65A is closed and the valve 67A is opened, the ejection of the high-temperature gas from the gas nozzle 31 of the processing part 2A is stopped, and the high-temperature gas is supplied to the pipe 66A and exhausted. Then, when the wafer W is held by the spin chuck 22 via the pins 36 and the wafer W starts rotating, the valve 67A is closed and the valve 65A is opened. As a result, the exhaust of the high-temperature gas through the pipe 66A is stopped, and the high-temperature gas is ejected from the gas nozzle 31 to start heating the wafer W (FIG. 6A). This high-temperature gas ejection corresponds to the high-temperature gas supply step.

Figure 6B:
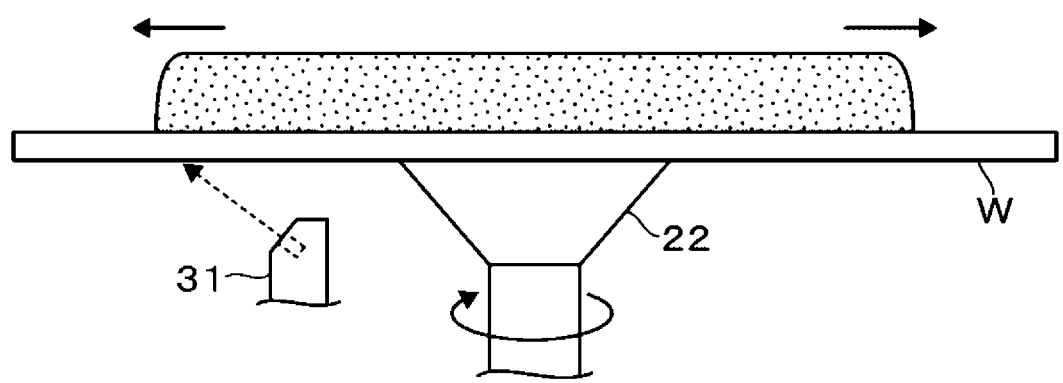
FIG. 6B is a process diagram illustrating processing in the coating film forming apparatus.
Figure 6C:
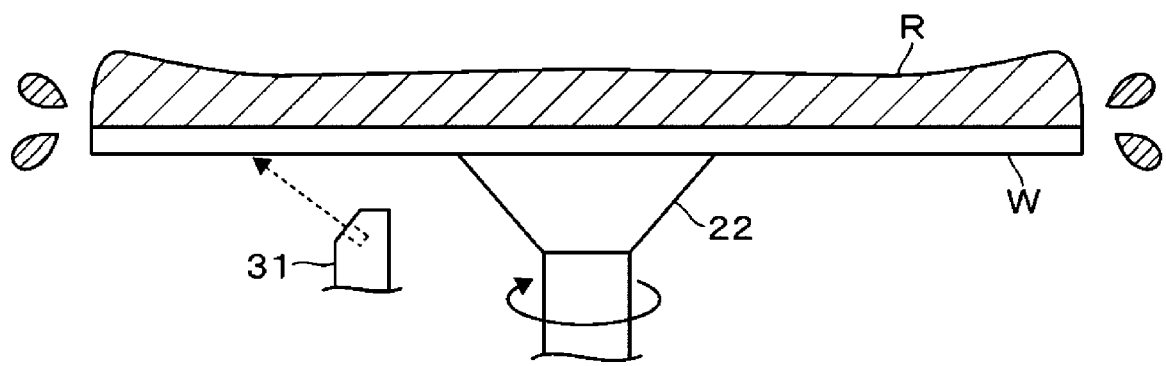
FIG. 6C is a process diagram illustrating processing in the coating film forming apparatus.

Subsequently, the thinner is ejected from the thinner ejection nozzle 43 to the central portion of the wafer W, and when a predetermined amount of thinner is ejected, the ejection is stopped. Due to the centrifugal force of the rotation of the wafer W, the thinner spreads to the peripheral edge of the wafer W, and the above-described pre-wetting is performed. Thereafter, when a predetermined amount of resist is ejected from the resist ejection nozzle 42 onto the central portion of the wafer W (time t1) and the ejection is stopped, the rotation speed of the wafer W increases (time t2), reaching a relatively high rotation speed d1. Then, the resist spreads toward the peripheral edge portion of the wafer W due to the centrifugal force of the rotation of the wafer W (FIG. 6B). Since the high-temperature gas has been being ejected before the resist is supplied to the wafer W, the wafer W is sufficiently heated, and the drying of the resist in the above-mentioned annular low-film thickness region, which is the front surface side of the position at which the high-temperature gas is ejected, is accelerated, and the deposition of solid components in the resist proceeds.

Figure 6D:
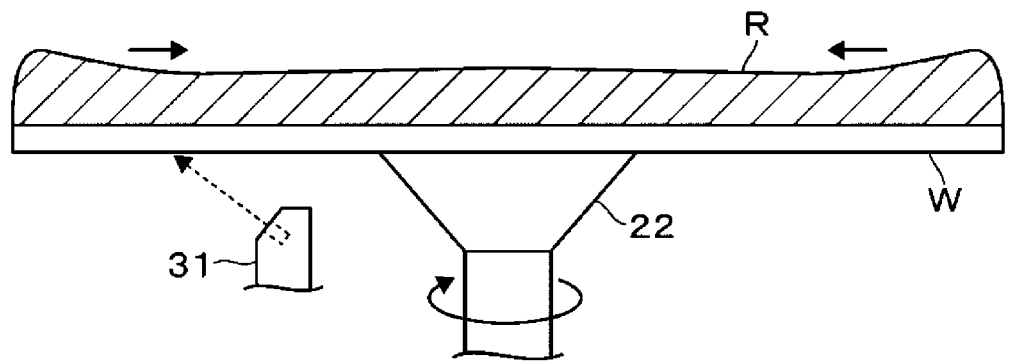
FIG. 6D is a process diagram illustrating processing in the coating film forming apparatus.

Thereafter, after a resist film R is formed due to the spreading of the resist over the entire front surface of the wafer W, thereby forming a resist film R (FIG. 6C), the rotation speed of the wafer W decreases (time t3) and reaches a rotation speed d2, which is a first rotation speed. The in-plane film thickness distribution of the wafer W is adjusted by the change in the rotation speed and the fluidity remaining in the resist forming the resist film R. Specifically, a portion of the resist, which was shifted to the peripheral edge side of the wafer W due to the rotation at the rotation speed d1, shifts to the center side of the wafer W due to the decrease in the centrifugal force due to the decrease in the rotation speed of the wafer W. Thus, the film thickness distribution changes such that the film thickness of the resist film proceeds to be uniform in the plane of the wafer W (FIG. 6D). On the other hand, the ejection of the high-temperature gas to the rear surface of the wafer W is continued, so that the drying in the annular region proceeds. The rotation speed d2 is, for example, 50 rpm to 500 rpm, and more specifically, for example, 100 rpm. The step of rotating the wafer W at the rotation speed d2 corresponds to a film thickness distribution adjusting step.

Thereafter, the rotation speed of the wafer W increases (time t4), reaching a rotation speed d3 higher than the rotation speed d2 and lower than the rotation speed d1. The period in which the wafer W is rotated at the rotation speed d3, which is a second rotation seed, is the period for changing the film thickness in the entire plane of the wafer W to obtain a desired film thickness. After the rotation speed is changed to this rotation speed d3, since the valve 65A is closed and the valve 67A is opened, the ejection of the high-temperature gas from the gas nozzle 31 is stopped and the exhaust of the high-temperature gas through the pipe 66A is restarted (time t5).

Figure 7A:
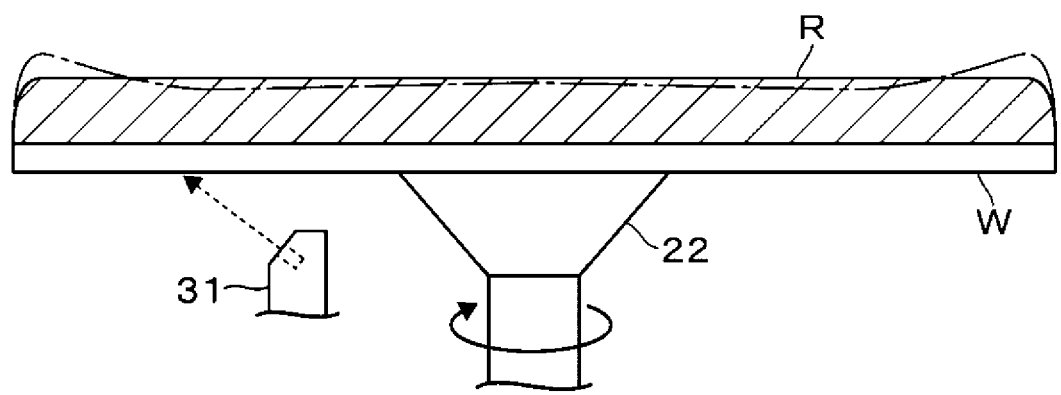
FIG. 7A is a process diagram illustrating processing in the coating film forming apparatus.

For example, immediately after the rotation speed is changed to d3, not only the film thickness in the entire plane of the wafer W, but also the in-plane film thickness distribution of the wafer W varies due to the solvent of the resist remaining in the resist film R. However, as the drying of the resist film R proceeds, such variation of the in-plane film thickness distribution is stopped (FIG. 7A). At that time, as described above, since the drying in the annular low film thickness region is accelerated, the variation of the film thickness in the region and the variation of the film thickness in the other regions are suppressed, and the film thickness is uniform in each portion of the wafer W in the radial direction.

Figure 7B:
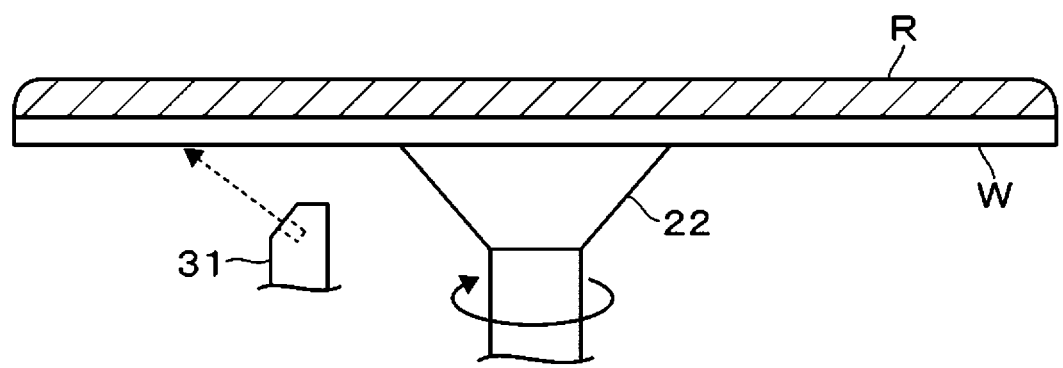
FIG. 7B is a process diagram illustrating processing in the coating film forming apparatus.

Thereafter, the rotation at the rotation speed d3 is continued, and the film thickness of the resist film R is reduced in the entire plane of the wafer W. This rotation speed d3 is, for example, 700 rpm to 2,000 rpm, and more specifically, for example, 1,000 rpm. The step of rotating the wafer W at the rotation speed d3 to change the film thickness in the entire plane of the wafer W corresponds to the drying step. As described above, since the ejection of the high-temperature gas to the wafer W is stopped during the rotation at the rotation speed d3, the period in which the drying step is performed overlaps the period in which the ejection of the high-temperature gas is stopped. Thus, drying proceeds in the entire plane of the wafer W while preventing excessive drying of the local region in the plane of the wafer W. That is, since the drying proceeds with high uniformity at each portion in the radial direction of the wafer W, the film thickness is reduced in the entire plane of the wafer W while preventing the occurrence and expansion of variation in the film thickness of the resist film R (FIG. 7B).

Figure 7C:
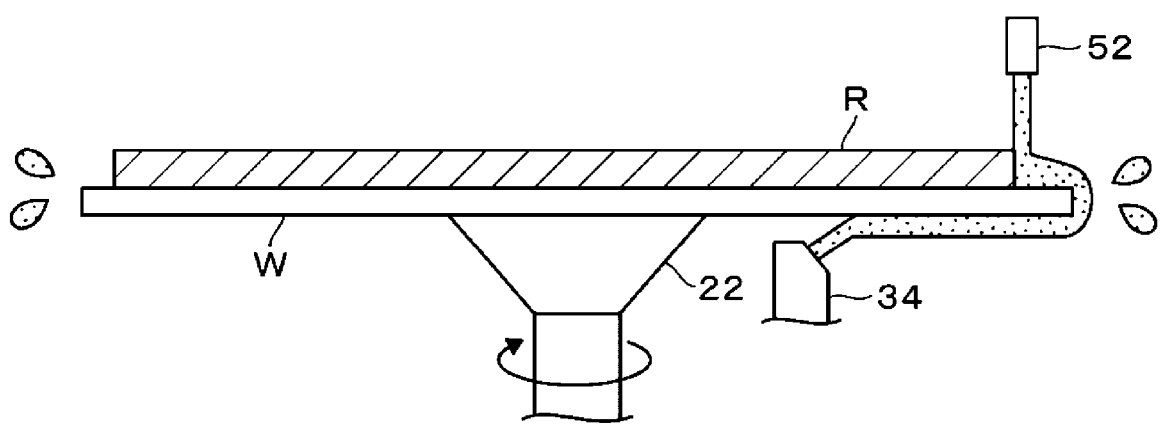
FIG. 7C is a process diagram illustrating processing in the coating film forming apparatus.
Figure 7D:
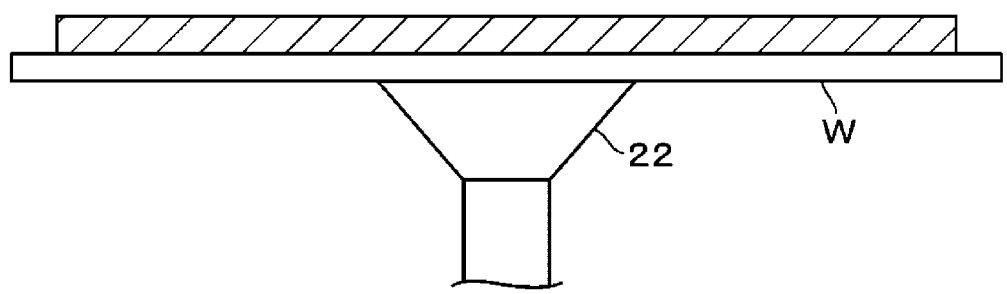
FIG. 7D is a process diagram illustrating processing in the coating film forming apparatus.

Then, when the film thickness of the resist film R reaches a desired size, the rotation speed of the wafer W increases (time t6), reaching a rotation speed d4 higher than the rotation speed d3 and lower than, for example, the rotation speed d1. Then, the thinner is ejected from the thinner ejection nozzle 52 to the peripheral edge portion of the front surface of the wafer W, and EBR in which the resist film R on the peripheral edge portion of the wafer W is removed is performed. In parallel with the ejection of the thinner to the peripheral edge portion of the front surface, the thinner, which is a cleaning liquid, is also ejected from the cleaning nozzle 34 to the rear surface of the wafer W, so that foreign matter adhering to the rear surface of the wafer W is removed (FIG. 7C). As described above, the interior of the cup 21A the temperature of which has risen due to the high-temperature gas is cooled by the ejection of the cleaning liquid. Thereafter, the ejection of the thinner from the thinner ejection nozzle 52 and the cleaning nozzle 34 is stopped, and the rotation of the wafer W is stopped after the thinner is removed by centrifugal force (FIG. 7D). Then, the wafer W is carried out from the coating film forming apparatus 1 in the reverse order of the carry-in procedure.

The case where the processing part 2A among the processing parts 2A and 2B processes a wafer W has been described as a representative, but when a wafer W is processed in the processing part 2B, each part of the apparatus operates as in the case where the processing is performed in the processing part 2A. However, the operations of the valves 65A and 67A in the above description should be replaced with the operations of the valves 65B and 67B.

As described above, in processing in the coating film forming apparatus 1, it is possible to prevent the formation of the annular low film thickness region described with reference to FIG. 2, and it is possible to form a resist film R with a highly uniform film thickness in the plane of a wafer W. According to such processing, which will be described later with an evaluation experiment, even if the amount of resist supplied to the wafer W is small, it is possible to form a resist film R on the front surface of the wafer W with high coatability. The apparatus disclosed in Patent Document 1 is configured such that heated gas is supplied to the entire peripheral edge portion of a substrate (a wafer W) that is not covered by the rotary table. In this configuration, each portion of the peripheral edge portion in the radial direction is uniformly heated. Therefore, it is difficult to prevent the formation of the above-described annular low-thickness region because it is impossible to control a local thickness in the radial direction.

The coating film forming apparatus 1 is incorporated in, for example, a system including a wafer W transport mechanism, and sequentially processes wafers W transported for each lot in the system. More specifically, in each of the processing parts 2A and 2B, after a plurality of wafers W belonging to one lot are sequentially transported, a plurality of wafers W belonging to another lot are sequentially transported. Since the processing parts 2A and 2B sequentially process the transported wafers W, the wafers W of one lot and the wafers W of the other lot are processed in this order in each of the processing parts 2A and 2B. Depending on the transport interval of the lots to the system and processing situation of each apparatus in the system, in each of the processing parts 2A and 2B, a relatively long period of time may be required from the termination of processing of the last wafer W of one lot to the start of processing of the first wafer W of another lot.

Hereinafter, a description will be made assuming that lots A and B are sequentially transported to the processing part 2A. The reason why each lot is transported as described above is that the transport interval between the last wafer W of the lot A and the first wafer W of the lot B (the transport interval between the lots A and B) may become longer than the transport interval between the second and subsequent wafers W in the same lot. When the transport interval between lots A and B becomes too long, the high-temperature gas is not supplied to the flow path from the downstream side of the valve 65A of the pipe 64A to the gas nozzle 31 for a long time. Thus, there is a risk that the flow path is cooled before the first wafer W in the lot B is processed, and thus the first wafer W in the lot B may not be sufficiently heated.

In order to prevent such a problem, the timing of starting the ejection of the high-temperature gas when processing the first wafer W in a lot may be made earlier than the timing of starting the ejection of the high-temperature gas when processing another wafer W in the same lot. That is, the timing of ejecting the heating gas to a wafer W is changed according to the transport interval between the particular wafer W and the wafer W placed on the spin chuck 22 immediately before the particular wafer W to the spin chuck 22.

A more specific description will be given with reference to the timing chart of FIG. 9. In FIG. 9, each of the period during which each of the last wafer W (indicated as AX) of the lot A, the first wafer W (indicated as B1) of the lot B, and the second wafer W (indicated as B2) of the lot B is placed on the spin chuck 22 of the processing part 2A, and the period during which the high-temperature gas is ejected to process each wafer W is indicated by white arrows. That is, the wafers AX, B1, and B2 are the wafers W that are successively transported to the spin chuck 22, in which, when the wafer AX is put as one substrate, the next substrate is the wafer B1, and when the wafer B1 is put as one substrate, the next substrate is the wafer B2.

In the chart, the time point at which each wafer W is placed on the spin chuck 22 is indicated as a placement start time point s1, and the time point at which the placement by the spin chuck 22 is terminated (the time point at which the wafer W is separated from the spin chuck 22) is indicated as a placement termination time point s4. As described above, the transport interval E1 between the lots A and B (the period of time from the placement termination time point s4 of wafer AX to the placement start time point s1 of the wafer B1) is longer than the transport interval between the wafers B1 and B2 (the period of time from the placement termination time point s4 of the wafer B1 to the placement start time point s1 of the wafer B2).

In processing the wafer B2, when a preset period of time E3 has elapsed from the placement start time point s1 of the wafer B2 and a time point s2 is reached, the ejection of the high-temperature gas is started. Then, processing is performed according to the procedure described with reference to FIGS. 6A to 7D, and a time point s3 when a predetermined period of time has elapsed from the placement start time point s1, the ejection of the high-temperature gas is stopped. This time point s3 is time t5 in the chart of FIG. 8. Each wafer W from the third and following wafers in the lot B is also processed in the same manner as the wafer B2 described here.

On the other hand, in processing the wafer B1, when a preset period of time E3' has elapsed from the placement start time point s1 at which the wafer B1 is placed on the spin chuck 22 and a time point s2' is reached, the ejection of the high-temperature gas is started. The period of time E3' is shorter than the period of time E3, and thus, when viewed from the placement start time point s1, the ejection of the high-temperature gas is started at a timing earlier than the timing in processing the wafer B2. Then, at the time point s3 when a predetermined time has elapsed from the placement start time point s1, the ejection of the high-temperature gas is stopped. Therefore, in the processing of the wafer B1, the period during which the high-temperature gas is ejected is longer than that in the processing of the wafer B2 by the time difference between E3 and E3'.

In this way, the ejection of the high-temperature gas from the gas nozzle 31 is started at a timing according to the transport interval of wafers W to the spin chuck 22 (which is also the period of time during which the apparatus waits without processing wafers W). As a result, the high-temperature gas ejection start timing differs between the wafer B1 and the wafer B2 when viewed from the placement start time point s1, and the wafer B1 is earlier than the wafer B2 in terms of this timing. Adjusting the high-temperature gas ejection start timing in such a manner is preferable since it is possible to more reliably prevent the above-described processing problems caused by the cooling of the high-temperature gas flow path. In making the ejection start timing for the processing of the wafer B1 earlier than the ejection start timing for the processing of the wafer B2 as described above, the ejection timing point may be set to a time point in the period after the placement termination time point S4 of the wafer AX and before the placement start point s1 of the wafer B1. That is, the ejection of the high-temperature gas for processing the wafer B1 may be started from a time point at which the wafer B1 is not placed on the spin chuck 22.

The present disclosure is not limited to continuously continuing to eject the high-temperature gas until the time point s3 after the ejection of the high-temperature gas is started. In the example illustrated in FIG. 10, the ejection of the high-temperature gas is started at a time point s40 during the period after the placement termination time point s4 of the wafer AX and before the placement start time point s1 of the wafer B1, and the ejection of the high-temperature gas is stopped at a time point s10. Since it is sufficient that the high-temperature gas is ejected for a period of time sufficient to prevent the cooling of the flow path of the high-temperature gas, for example, the period of time from the time point s40 to the time point s10 is shorter than the period of time from the time point s2 to the time point s3, which is a high-temperature gas ejection period after the placement start time point s1. In the example illustrated in FIG. 10, unlike the example illustrated in FIG. 9, as for the wafer B1 as well, the ejection of the high-temperature gas is started from the time point s2 after the placement start time point s1, like the wafer B2.

It has been described that, if a wafer W is the first wafer W in a lot, the high-temperature ejection start timing is unconditionally made earlier compared to the other wafers W in the same lot, but the present disclosure is not limited to doing so. Specifically, for example, the length of the transport interval E1 is compared with the length of a predetermined set period of time. As a result of the comparison, when the transport interval E1 is shorter than the set period of time, the wafer B1 is processed in the same manner as the wafer B2. That is, in processing the wafer B1, the ejection of the high-temperature gas is started at the time point s2 in the same manner as the wafer B2, and the ejection of the high-temperature gas is also not performed during a period from the placement termination time point s4 of the wafer AX to the placement start time point s1 of the wafer B1 illustrated in FIG. 10. As a result of the comparison, when the transport interval E1 is longer than the set period of time, the ejection start time point of the high-temperature gas when processing the wafer B1 is made earlier than that when the transport interval E1 is shorter than the set period of time. Accordingly, the ejection may be started at time point s2' earlier than time point s2 as illustrated in FIG. 9, or the ejection may be performed from the time point s40 to the time point s10 as illustrated in FIG. 10.

Next, a coating film forming apparatus 1A, which is a modification of the coating film forming apparatus 1, will be described with reference to the plan view of FIG. 11, focusing on differences from the coating film forming apparatus 1. The pipe 66A of the coating film forming apparatus 1A is not connected to the exhaust path, and a gas nozzle 71A is provided at the downstream end of the pipe 66A. The gas nozzle 71A, which is a cup temperature adjustment nozzle, is disposed at the rear of the cup 21A and near the right end of the same in a plan view. The length of the pipe 66A is set such that the high-temperature gas supplied to the pipe 66A is naturally cooled while flowing through the pipe 66A and is ejected from the gas nozzle 71A as normal temperature gas.

By arranging the pipes as described in the description of the coating film forming apparatus 1, on the rear side of the cup 21A (i.e., one of the front and rear sides), the downstream side of the pipe 63, the upstream sides from the positions at which the valves 65A and 65B are installed, respectively, in the pipes 64A and 64B, and portions of the pipes 66A and 66B are located to extend in the left-right direction. Respective portions of these pipes are thereby located on the rear side with respect to the cup 21A. That is, the cup 21A and the respective portions are arranged in the front-rear direction. The respective portions are collectively illustrated as a piping part 72A surrounded by the dotted line in the drawing. The ejection port of the gas nozzle 71A is opened leftward at a position between the piping part 72A and the cup 21A. During the period in which the high-temperature gas is not ejected from the gas nozzle 31 of the cup 21A, the normal temperature gas is ejected leftward (that is, to one of the left and right sides) in the extending direction of each pipe of the piping part 72A and the cup 21A in a plan view.

As described above, since the piping part 72A includes the upstream sides of the valves 65A and 65B in the pipes 64A and 64B and the pipe 63, the high temperature gas flows therethrough while the ejection of the high-temperature gas is not performed from the gas nozzle 31 of the cup 21A. When the temperature of the high-temperature gas flowing through the piping part 72A is relatively high, the radiant heat from the piping part 72A becomes relatively great. When the cup 21A is heated by the radiant heat, the wafer W transported to and processed in the cup 21A is heated by the cup 21A. Thus, there is a concern that the thickness of the resist film R formed on the wafer W may deviate from a set value. However, as described above, the normal temperature gas ejected from the gas nozzle 71A blocks the heat radiation from the piping part 72A to the cup 21A, suppressing the temperature rise of the cup 21A. Thus, deviation in film thickness of the resist film R is suppressed.

From a different point of view, supplying the normal temperature gas from the gas nozzle 71A in this way means that even if the temperature of the high-temperature gas ejected from the gas nozzle 31 is relatively high, each of the pipes of the piping part 72A may be provided along the radial direction of the cup 21A and aligned with the cup 21A so as to place it close to the cup 21A. That is, with the coating film forming apparatus 1A, there is an advantage in that it is possible to prevent an increase in the exclusive floor area of the apparatus 1A.

Figure 11:
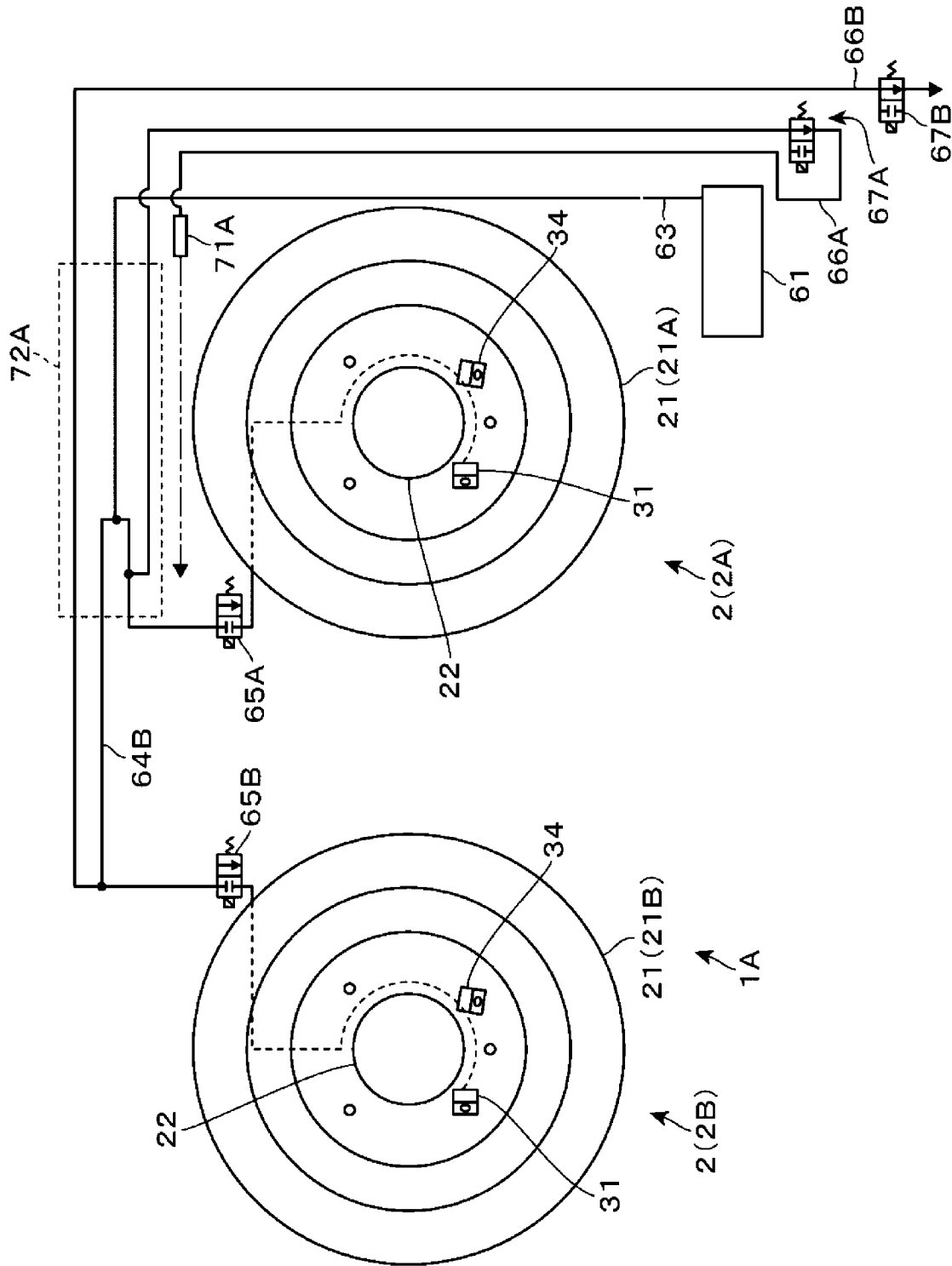
FIG. 11 is a plan view illustrating a modification of the coating film forming apparatus.

In FIG. 11, the two-dot chain line arrow indicates the normal temperature gas ejected from the gas nozzle 71A. In the example illustrated in FIG. 11, in a plan view, the ejection direction of the normal temperature gas is parallel to the extending direction of each pipe of the piping part 72A. However, since it is sufficient that the heat from the piping part 72A to the cup 21A is blocked, the ejection direction is not limited to being parallel. For example, the gas nozzle 71A may be disposed such that the normal temperature gas is ejected leftward and frontward, and the ejection direction of the normal temperature gas may be inclined with respect to the extending direction of each pipe of the piping part 72A. As described above, the normal temperature gas ejected from the gas nozzle 71A is a cup temperature adjustment gas for adjusting the temperature of the cup 21A.

Figure 12:
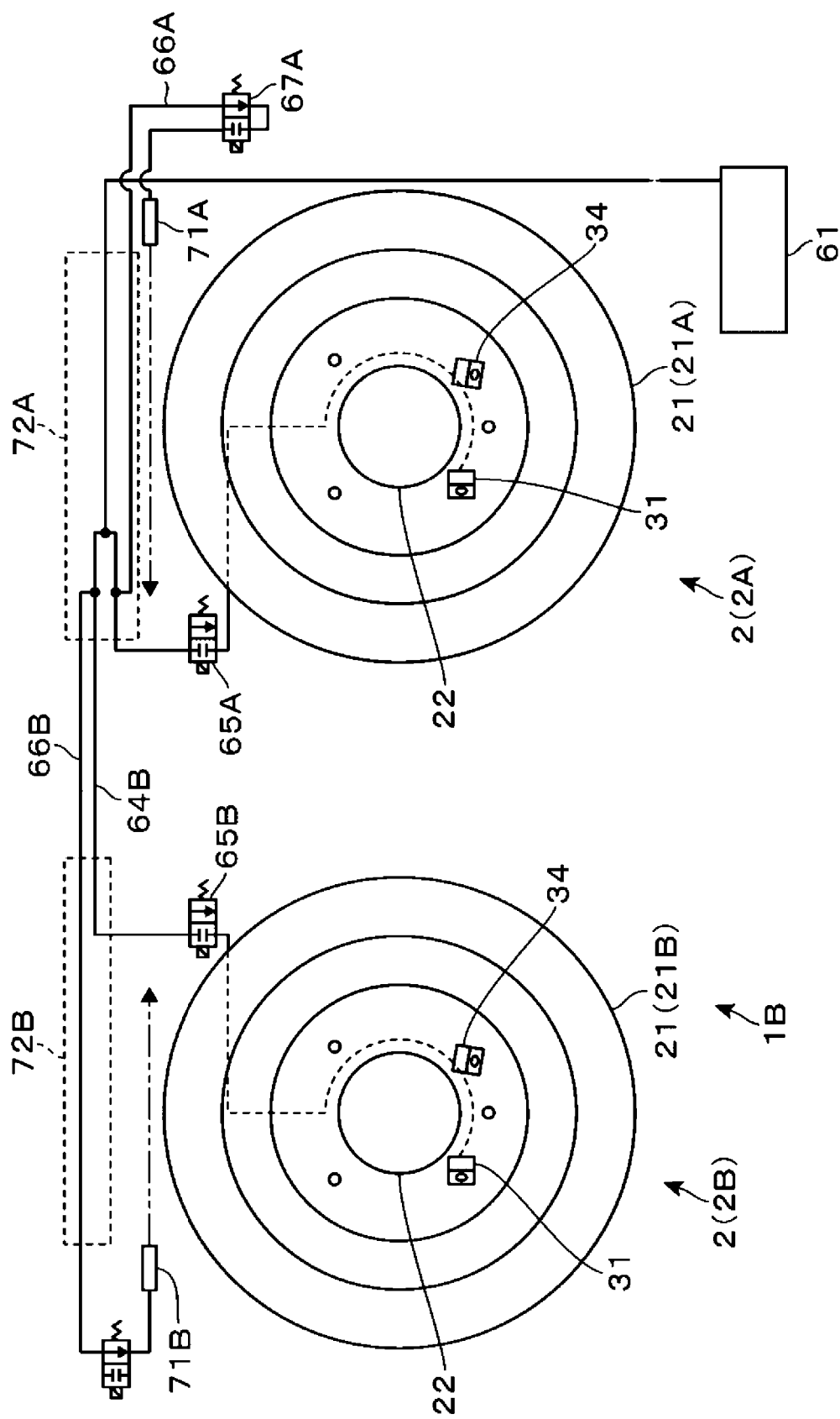
FIG. 12 is a plan view illustrating another modification of the coating film forming apparatus.

Next, a coating film forming apparatus 1B, which is a modification of the coating film forming apparatus 1, will be described with reference to the plan view of FIG. 12, focusing on differences from the coating film forming apparatus 1A. Like the coating film forming apparatus 1A, the coating film forming apparatus 1B includes a gas nozzle 71A, but the length of the pipe 66A connected to the gas nozzle 71A is relatively short. Therefore, gas having, for example, a temperature higher than normal temperature is discharged from the gas nozzle 71A. In the coating film forming apparatus 1B, the downstream end of the pipe 66B is not connected to the exhaust path, but is connected to a gas nozzle 71B. As in the gas nozzle 71A, the length of the pipe 66B is adjusted such that gas having a temperature higher than normal temperature is ejected from the gas nozzle 71B.

The gas nozzle 71B is disposed at the rear of the cup 21B and near the left end of the cup 21B in a plan view. On the rear side of the cup 21B, the upstream side of the valve 65B in the pipe 64B and a portion of the pipe 66B are disposed to extend in the left-right direction. As a result, respective portions of these pipes are aligned with the cup 21B and extend in the radial direction of the cup 21B in a plan view, and the respective portions are collectively illustrated as a piping part 72B surrounded by a dotted line in the drawing. The gas nozzle 71B ejects gas rightward in the extending direction of each pipe between each pipe of the piping part 72B and the cup 21B in a plan view.

The cups 21A and 21B are heated by gases ejected from the gas nozzles 71A and 71B, respectively. Accordingly, when wafers W are carried into the cups 21A and 21B, the wafers W are also heated. Since the resist supplied to the heated wafers W in this way is accelerated to dry when the resist spreads over the wafers W, the amount of the resist scattered from the wafers W is suppressed. Therefore, it is possible to control the film thickness of the resist film R to a relatively large desired film thickness.

If only considering the heating of the cups 21A and 21B by the gases from the gas nozzles 71A and 71B, the ejection ports of the gas nozzles 71A and 71B may be directed to the cups 21A and 21B, respectively. However, as described in the description of the coating film forming apparatus 1A, since the temperature of the piping part 72A including the flow path on the upstream side of the valve 65A becomes relatively high, there is a possibility that the radiant heat to the cup 21A becomes relatively great. For the same reason, there is a concern that the radiant heat from the piping part 72B to the cup 21B may also become great. By adopting a configuration in which gases are ejected between the cups 21A and 21B and the piping parts 72A and 72B illustrated in FIG. 12, an excessive temperature rise of the cups 21A and 21B is suppressed since the radiant heat is shielded by the gas. On the other hand, the heat of the gases from the gas nozzles 71A and 71B may heat the cups 21A and 21B to an appropriate temperature. That is, the configuration of FIG. 12 is preferable from the viewpoint that the controllability on the heating temperature of the cups 21A and 21B may be enhanced.

Figure 13:
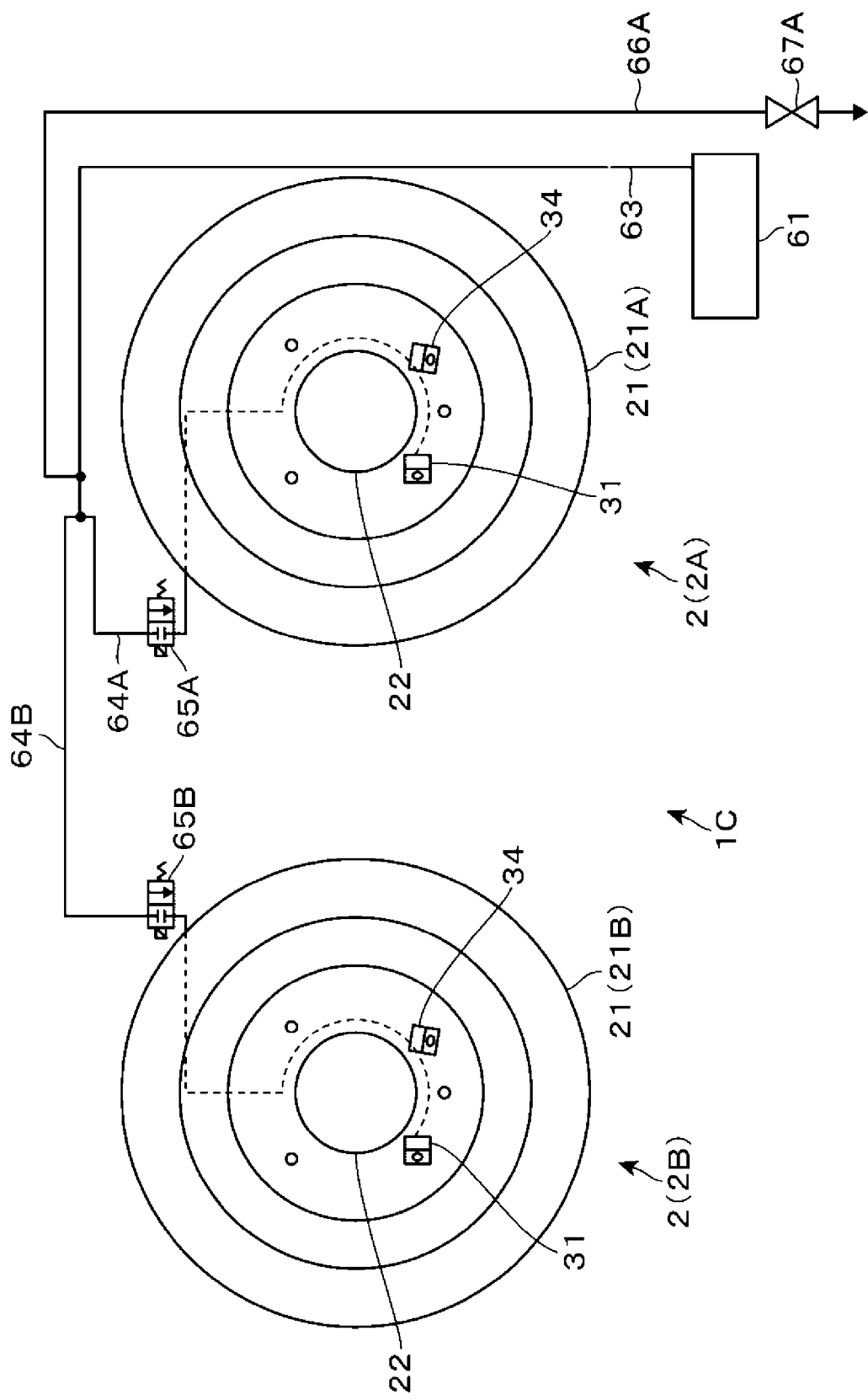
FIG. 13 is a plan view illustrating still another modification of the coating film forming apparatus.

Next, a coating film forming apparatus 1C, which is a modification of the coating film forming apparatus 1, will be described with reference to the plan view of FIG. 13, focusing on differences from the coating film forming apparatus 1. Only the pipe 66A among the pipes 66A and 66B is provided in the coating film forming apparatus 1C, and the upstream end of the pipe 66A is connected to the pipe 63 instead of being connected to the pipe 64A. As the valve 67A interposed in the pipe 66A, for example, a valve capable of adjusting the flow rate to the downstream side is used.

For example, in order to cause the high-temperature gas supplied from the heating mechanism 61 to be supplied to the pipe 66A to be exhausted during the period in which the high-temperature gas is not ejected from the gas nozzle 31 of any of the cups 21A and 21B, both of the valves 65A and 65B are closed, and the opening degree of the valve 67A is set to a first opening degree. During the period in which the high-temperature gas is ejected from the gas nozzle 31 of one of the cups 21A and 21B, in order to cause the supply of the high-temperature gas to the gas nozzle 31 and the supply of the high-temperature gas to the pipe 66A to be performed, only one of the valves 65A and 65B is opened, and the opening degree of the valve 67A is adjusted to a second opening degree smaller than the first opening degree.

The high-temperature gas may be ejected in both cups 21A and 21B. However, in order to supply sufficient high-temperature gas from one gas nozzle 31 and stabilize the gas flow in each pipe, the parallel supply of the high-temperature gas in the cups 21A and 21B is not performed in this example. Therefore, in the coating film forming apparatus 1C, each valve operates such that the high-temperature gas always flows through the pipe 66A, which is an exhaust pipe. As described using the coating film forming apparatus 1C as an example, a pipe constituting an exhaust pipe is not limited to being provided individually for each of the cups 21A and 21B as in the examples described above.

It has been described that a resist having a viscosity within the range already exemplified is used for the purpose of forming a resist film R having a relatively great film thickness, but the present technology is not limited to using such a resist having a relatively high viscosity. The present technology is also applicable when forming a thin film by using a relatively low viscous resist. When forming a resist film R having a relatively great film thickness by using a resist having a relatively high viscosity, if the film thickness varies due to such a great film thickness, there is a concern that the width of the variation (the maximum value minus the minimum value for the film thickness) may also be relatively great. From the viewpoint that the variation of film thickness that may become relatively great can be reduced, it is particularly effective to apply the present technology when using a resist having a relatively high viscosity within the above-described range.

The rotation speed d3 for performing the drying step described with reference to FIG. 8 is set depending on the desired film thickness, and when forming such a film, the rotation speed d4 may set higher than the rotation speed d4 for EBR and rear surface cleaning. In this manner, the magnitude relationship between the rotation speeds d3 and d4 may be set arbitrarily. In addition, in the example described with reference to FIG. 8, it was described that the change in film thickness distribution is not terminated during rotation at the rotation speed d2, but also occurs during rotation at the rotation speed d3. However, the change in film thickness distribution may be terminated during rotation at the rotation speed d2.

The timing of starting the ejection of the high-temperature gas to the wafer W is not limited to the example described above. For example, the ejection of the high-temperature gas may be performed before the entire front surface of the wafer W is coated with the resist by the rotation of the wafer W. However, in order to ensure that the drying of the resist in the annular low-film thickness region is accelerated, the ejection of the high-temperature gas is started preferably before ejection of the resist and after the ejection of the thinner for pre-wetting, and more preferably before the ejection of the thinner as described with reference to FIG.

6A. As for the high-temperature gas, it is sufficient that the high-temperature gas has a temperature that may affect on the film thickness distribution of the resist film R by heating the wafer W when ejected onto the wafer W, as described above. Thus, the high-temperature gas is not limited to the exemplified temperature. In order to obtain this action, it is sufficient that the temperature of the high-temperature gas is higher than the temperature of the wafer W at the start of ejection to the wafer W.

Regarding the timing of stopping the ejection of the high-temperature gas, as long as the in-plane film thickness uniformity of the wafer W can be improved, the ejection may be stopped, for example, during the rotation of the wafer W at the rotation speed d2 before the rotation at the above-mentioned rotation speed d3, without being limited to being stopped during the rotation of the wafer W at the rotation speed d3. In addition, the high-temperature gas may be intermittently ejected to the wafer W. The timing of stopping described here does not mean the timing of temporarily stopping the ejection of the high-temperature gas to the wafer W in the case of intermittent ejection, but means the timing at which the high-temperature gas is no longer ejected to the wafer W thereafter in processing the wafer W.

Any kind of high-temperature gas may be used as long as it does not affect the processing of the wafer W. For example, an inert gas such as nitrogen ($N_2$) gas may be used. Moreover, the coating film formed on the wafer W is not limited to a resist film, and may be an antireflection film, an insulating film, or the like. As the coating liquid, instead of the resist, a coating liquid suitable for a film to be formed on a substrate may be used.

The embodiments disclosed herein should be considered to be exemplary in all respects and not restrictive. The above-described embodiments may be omitted, replaced, modified, and/or combined in various forms without departing from the scope and spirit of the appended claims.

[Evaluation Experiment]

An evaluation experiment related to the present technology will be described. In the evaluation experiment, each wafer W was processed to form a resist film R thereon while changing the amount of the resist ejected onto each wafer W within the range of e mL to e+4 mL (e is a positive number). In this evaluation experiment, a resist having a viscosity of 610 CP was used. As Example 1-1, resist films R were formed by processing the wafers W according to the procedure described with reference to FIGS. 6A to 7D. That is, the resist films R were formed while ejecting a high-temperature gas onto the rear surfaces of the wafers W. However, EBR was not performed. The rotation speed (the above-described rotation speed d1) for spreading the resist on the wafers W was changed for each wafer W, and was set to any one of f1 rpm, f2 rpm, and f3 rpm. f1 to f3 are positive numbers, and f1<f2<f3.

As Comparative Example 1-1, the wafers W were processed in the same manner as in Example 1-1, except that the high-temperature gas was not ejected to the rear surfaces of the wafers W, and the thinner was ejected to positions eccentric from the centers of the wafers W during pre-wetting. As Comparative Example 1-2, wafers W were processed in the same manner as in Example 1-1, except that the high-temperature gas was not ejected to the rear surfaces of the wafers W. That is, in Comparative Example 1-2, the pre-wetting was performed by ejecting the thinner to the central portions of the wafers W. For each wafer W processed as Example 1-1, Comparative Example 1-1, and Comparative Example 1-2, the coatability of the resist film R was confirmed, and the maximum value minus the minimum value of the film thickness of the resist film R was measured. Hereinafter, the maximum value minus the minimum value of the film thickness will be described as a "film thickness range".

Table 1 shows the results of comparison of coatability. A in the table indicates that coatability is good and no spots are present on the film. B indicates that coatability is good, but spots are present on the film. C indicates that coatability is not acceptable.

TABLE 1

| Examples | rpm | Ejection amount | | | | | | |
|---|---|---|---|---|---|---|---|---|
| | | e | e + 1 | e + 1.5 | e + 2 | e + 3 | e + 4 | e + 5 |
| Example 1-1 | f1 | C | C | A | A | A | A | A |
| | f2 | C | A | A | A | A | A | A |
| | f3 | C | A | A | A | A | A | A |
| Comparative Example 1-1 | f1 | C | C | C | C | B | B | B |
| | f2 | C | C | C | C | B | B | B |
| | f3 | C | C | C | B | B | B | B |
| Comparative Example 1-2 | f1 | C | C | A | A | A | A | A |
| | f2 | C | A | A | A | A | A | A |
| | f3 | C | A | A | A | A | A | A |

As shown in Table 1, Example 1-1 and Comparative Example 1-2 were better than Comparative Example 1-1, and Example 1-1 and Comparative Example 1-2 were equivalent to each other. More specifically, in Comparative Example 1-1, when the ejection amount of the resist was relatively large within the range of the ejection amount of the resist set in this evaluation experiment, although spots were observed in the resist films R, sufficient coatability was obtained. However, when the ejection amount of the resist was relatively small, the coatability was also insufficient. When the rotation speed of the wafer W was f3 rpm, coatability was insufficient with a smaller ejection amount compared to the case where the rotation speeds were f2 and f1 rpm.

In addition, regardless of the rotation speeds f1 to f3 rpm, in Example 1-1 and Comparative Example 1-2, it was possible to obtain sufficient coatability with an ejection amount equal to or less than the ejection amount with which the coatability was insufficient in Comparative Example 1-1. When comparing Example 1-1 and Comparative Example 1-2, there was no difference in whether the coatability was sufficient or insufficient when the rotation speeds and the ejection amounts were the same. In addition, no spots were observed in the resist films R having sufficient coatability in Example 1-1 and Comparative Example 1-2.

Figure 14:
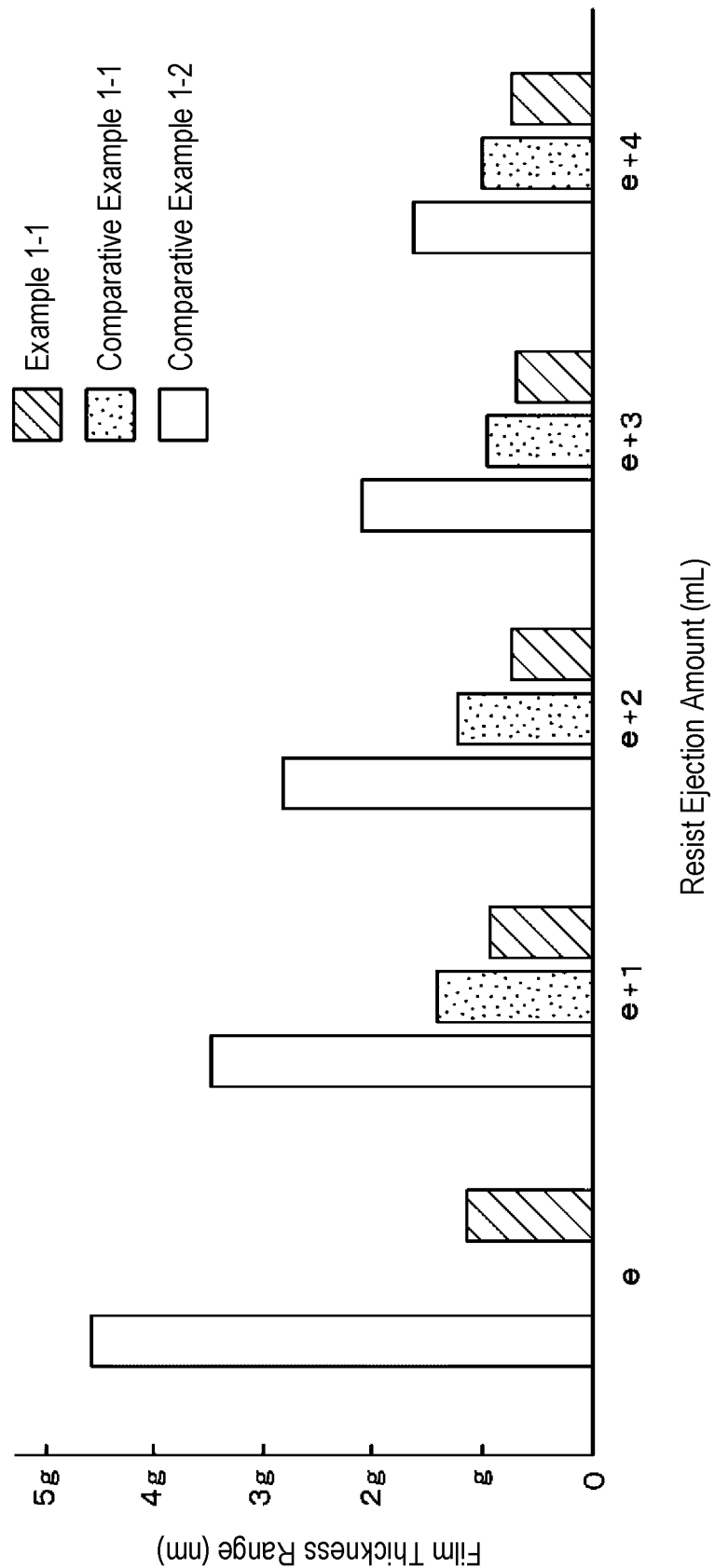
FIG. 14 is a graph showing results of an evaluation experiment.
Figure 15:
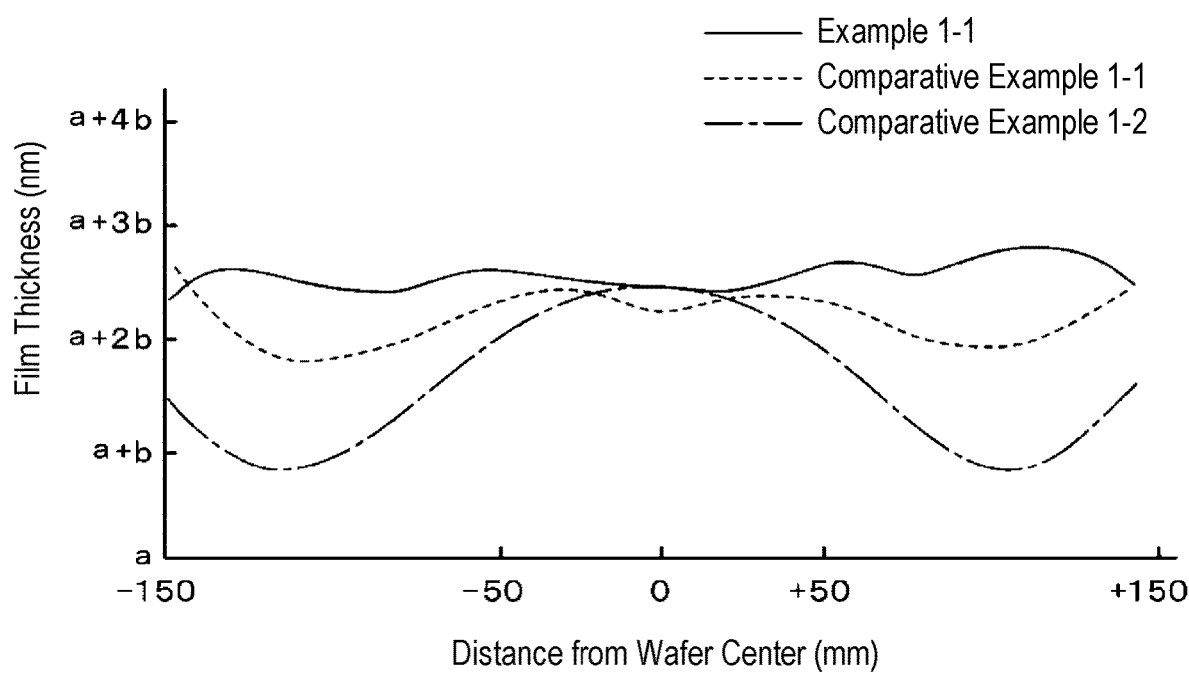
FIG. 15 is a graph showing results of an evaluation experiment.

The results for film thickness ranges are shown as bar graphs in FIG. 14. g on the vertical axis of the graph represents a positive number, and markings are provided on the vertical axis at a predetermined interval. For the experiment conducted with an ejection volume set to e+1 mL, FIG. 15 shows a graph showing film thickness distributions in the radial direction of the wafers W in the same manner as in FIG. 2.

As shown in FIG. 14, the film thickness range of Example 1-1 is smaller than that of Comparative Example 1-2 regardless of the ejection amount. That is, Example 1-1 is superior in film thickness uniformity. Further, as shown in the graph of FIG. 15, in Comparative Example 1-2, an annular low-film thickness region described with reference to FIG. 2 or the like was formed between the central portion and peripheral edge portion of each wafer W. However, in Example 1-1, this annular low-film thickness region was not formed, and thus the film thickness uniformity was high. That is, the effect of ejecting the above-described high-temperature gas was shown. As described above, from this evaluation experiment, it was shown that with the method described in the embodiment, it is possible to form a resist film R with high coatability on a wafer W and high film thickness uniformity in the plane of a wafer W.

With the present disclosure, in forming a coating film on a substrate by supplying a coating liquid to the substrate, it is possible to improve the controllability of the film thickness of the coating film in the plane of the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A coating film forming method comprising:
coating a coating liquid by supplying the coating liquid to a central portion of a front surface of a substrate and rotating the substrate to spread the coating liquid to a peripheral edge portion of the substrate to form a coating film;
supplying a high-temperature gas having a temperature higher than a temperature of the substrate supplied with the coating liquid to a portion of an exposed region of a rear surface of the rotating substrate;
adjusting film thickness distribution of the coating film in a plane of the substrate by rotating the substrate at a first rotation speed;
drying, after the adjusting the film thickness distribution, the coating film by adjusting a film thickness of the coating film in an entire plane of the substrate by rotating the substrate at a second rotation speed different from the first rotation speed; and
cleaning, after the drying, the rear surface of the substrate by supplying a cleaning liquid to the exposed region of the rear surface of the rotating substrate,
wherein:
a period in which the drying of the coating film is performed includes a period in which the supplying of the high-temperature gas to the substrate is stopped,
the supplying the high-temperature gas includes ejecting the high-temperature gas from a first ejection port provided in a gas nozzle,
the cleaning includes ejecting the cleaning liquid from a second ejection port provided in a cleaning nozzle, and
a first contact region which is a contact region of the high-temperature gas on the rear surface of the substrate when the high-temperature gas is ejected from the first ejection port is located on a downstream side in a rotating direction of the substrate with respect to a second contact region which is a contact region of the cleaning liquid on the rear surface of the substrate when the cleaning liquid is ejected from the second ejection port.

2. The coating film forming method of claim 1, wherein the supplying the high-temperature gas includes ejecting the high-temperature gas from a gas nozzle to the exposed region of the rear surface of the substrate, and
the ejection direction of the high-temperature gas follows the rotating direction of the substrate.

3. The coating film forming method of claim 1, wherein the supplying the high-temperature gas to the substrate begins before the supplying of the coating liquid to the substrate.

4. The coating film forming method of claim 1, wherein the supplying the high-temperature gas includes ejecting the high-temperature gas from a gas nozzle to the exposed region of the rear surface of the substrate, and
the coating, the supplying the high-temperature gas, the adjusting the film thickness distribution, and the drying are performed on the substrate placed on a stage, and
wherein the coating film forming method further comprises:
sequentially transporting a plurality of substrates to the stage; and
starting, at a timing determined based on a transport interval between one substrate to a next substrate that is subsequently transported to the stage, ejection of the high-temperature gas from the gas nozzle to process the next substrate.

5. The coating film forming method of claim 1, wherein the supplying the high-temperature gas includes ejecting the high-temperature gas from a gas nozzle to the exposed region of the rear surface of the substrate,
wherein a gas supply path including a downstream end connected to the gas nozzle, a branch path branching from the gas supply path, and a switching part configured to switch a supply destination of the high-temperature gas between the gas nozzle and the branch path are provided, and
wherein the supplying the high-temperature gas includes switching by the switching part from a state in which the high-temperature gas is supplied to the branch path to a state in which the high-temperature gas is supplied to the gas nozzle.

6. The coating film forming method of claim 5, wherein the coating, the supplying the high-temperature gas, the adjusting the film thickness distribution, and the drying are performed on the substrate placed on a stage and surrounded by a cup, and
wherein the switching part is provided at a height lower than the cup.

7. The coating film forming method of claim 5, wherein the coating, the supplying the high-temperature gas, and the drying are performed on the substrate placed on a stage and surrounded by a cup,
wherein the gas supply path includes a portion that extends in a left-right direction at an upstream side of a position where the switching part is provided, the portion being provided parallel to the cup at one of front and rear sides of the cup, and
wherein the coating film forming method further comprises:
ejecting the high-temperature gas, which is supplied to the branch path, from a cup temperature adjustment nozzle connected to a downstream end of the branch path to one of left and right sides between the portion and the cup as a temperature adjustment gas for the cup.

* * * * *